US009793219B2

(12) United States Patent
Shimizu

(10) Patent No.: US 9,793,219 B2
(45) Date of Patent: Oct. 17, 2017

(54) SEMICONDUCTOR ELEMENT BUILT-IN WIRING BOARD AND METHOD FOR MANUFACTURING THE SAME

(71) Applicant: IBIDEN CO., LTD., Ogaki-shi (JP)

(72) Inventor: Keisuke Shimizu, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 15/040,129

(22) Filed: Feb. 10, 2016

(65) Prior Publication Data
US 2016/0233167 A1    Aug. 11, 2016

(30) Foreign Application Priority Data
Feb. 10, 2015   (JP) .................................. 2015-024575

(51) Int. Cl.
*H01L 21/66*   (2006.01)
*H01L 21/00*   (2006.01)
(Continued)

(52) U.S. Cl.
CPC ........ *H01L 23/5389* (2013.01); *H01L 21/486* (2013.01); *H01L 21/4857* (2013.01); *H01L 21/6835* (2013.01); *H01L 23/5383* (2013.01); *H01L 23/5384* (2013.01); *H01L 24/19* (2013.01); *H01L 24/20* (2013.01); *H01L 24/24* (2013.01); *H01L 23/3121* (2013.01); *H01L 23/49811* (2013.01); *H01L 23/49866* (2013.01); *H01L 23/49894* (2013.01); *H01L 2221/68318* (2013.01); *H01L 2221/68345* (2013.01); *H01L 2221/68359* (2013.01);
(Continued)

(58) Field of Classification Search
CPC ......... H01L 23/49833; H01L 23/49861; H01L 23/49506; H01L 23/49558; H01L 23/49586
See application file for complete search history.

(56) References Cited

U.S. PATENT DOCUMENTS

| 6,724,638 B1* | 4/2004 | Inagaki ............... H01L 21/4857 257/E23.062 |
| 2004/0074088 A1* | 4/2004 | Nakamura .......... H01L 21/4857 29/831 |
| 2012/0186861 A1* | 7/2012 | Shimizu .............. H01L 23/5389 174/255 |

FOREIGN PATENT DOCUMENTS

JP    2001-345560 A    12/2001

* cited by examiner

*Primary Examiner* — Mary Wilczewski
*Assistant Examiner* — Tsz Chiu
(74) *Attorney, Agent, or Firm* — Oblon, McClelland, Maier & Neustadt, L.L.P.

(57) ABSTRACT

A wiring board includes a base substrate, a semiconductor element embedded in the substrate and having active and non-active surfaces such that the semiconductor has a terminal on the active surface, a first build-up layer including an insulating layer and first conductor pads such that the first conductor pads have exposed surfaces exposed from a surface of the insulating layer on the opposite side with respect to the substrate, and a second build-up layer including an insulating layer and second conductor pads such that the second conductor pads have exposed surfaces exposed from a surface of the insulating layer on the opposite side with respect to the substrate. The insulating layer in the first build-up includes resin material and reinforcing material, the insulating layer in the second build-up includes resin material and reinforcing material, and the first conductor pads is embedded in the insulating layer in the first build-up.

16 Claims, 44 Drawing Sheets

(51) Int. Cl.
    *H01L 29/40*         (2006.01)
    *H01L 23/52*         (2006.01)
    *H01L 23/48*         (2006.01)
    *H01L 23/538*        (2006.01)
    *H01L 21/48*         (2006.01)
    *H01L 21/683*        (2006.01)
    *H01L 23/00*         (2006.01)
    H01L 23/498        (2006.01)
    H01L 23/31         (2006.01)

(52) U.S. Cl.
    CPC ............... *H01L 2221/68372* (2013.01); *H01L 2221/68381* (2013.01); *H01L 2224/04105* (2013.01); *H01L 2224/16227* (2013.01); *H01L 2224/24227* (2013.01); *H01L 2224/32245* (2013.01); *H01L 2224/73267* (2013.01); *H01L 2224/8203* (2013.01); *H01L 2224/82005* (2013.01); *H01L 2224/83005* (2013.01); *H01L 2224/83191* (2013.01); *H01L 2224/92244* (2013.01); *H01L 2225/1035* (2013.01); *H01L 2225/1058* (2013.01); *H01L 2924/15153* (2013.01); *H01L 2924/15311* (2013.01); *H01L 2924/15313* (2013.01)

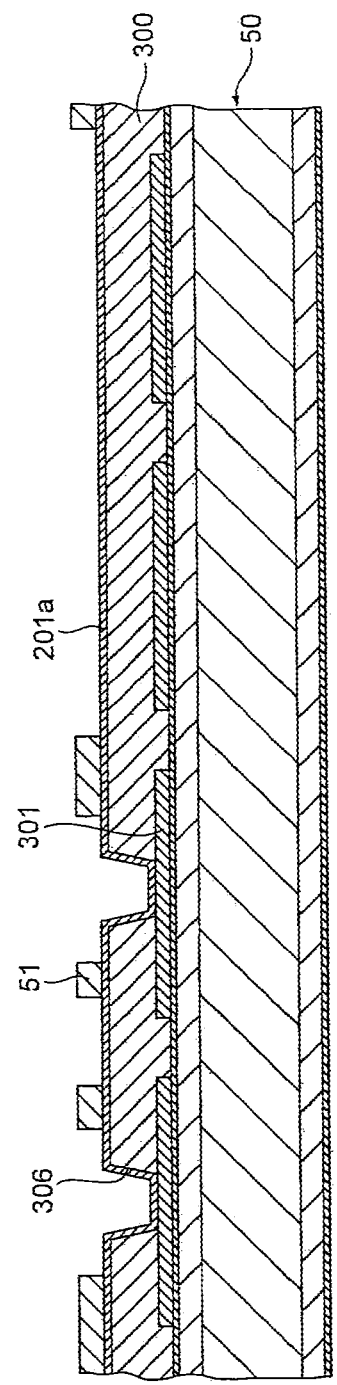

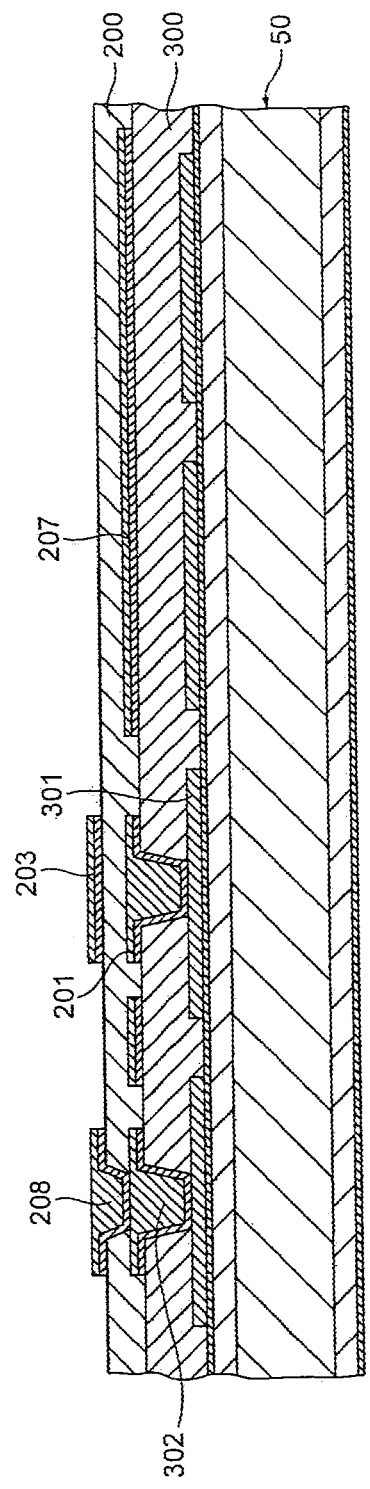

SEMICONDUCTOR ELEMENT BUILT-IN WIRING BOARD AND METHOD FOR MANUFACTURING THE SAME

CROSS-REFERENCE TO RELATED APPLICATIONS

The present application is based upon and claims the benefit of priority to Japanese Patent Application No. 2015-024575, filed Feb. 10, 2015, the entire contents of which are incorporated herein by reference.

BACKGROUND OF THE INVENTION

Field of the Invention

The present invention relates to a semiconductor element built-in wiring board and a method for manufacturing the semiconductor element built-in wiring board.

Description of Background Art

Japanese Patent Laid-Open Publication No. 2001-345560 describes a semiconductor element built-in wiring board which includes a core substrate, a capacitor that is embedded inside the core substrate, an upper side build-up layer that is formed by laminating an insulating layer and a conductor layer on an upper side of the core substrate, and a lower side build-up layer that is formed by laminating an insulating layer and a conductor layer on a lower side of the core substrate. The core substrate is formed of a glass-epoxy resin composite material, and the insulating layers are formed of an epoxy resin. The entire contents of this publication are incorporated herein by reference.

SUMMARY OF THE INVENTION

According to one aspect of the present invention, a wiring board having a built-in semiconductor element includes a base substrate, a semiconductor element embedded in the base substrate and having an active surface and a non-active surface on the opposite side with respect to the active surface such that the semiconductor element has a terminal on the active surface, a first build-up layer including an insulating layer and first conductor pads such that the insulating layer is formed on a non-active surface side of the semiconductor element and that the first conductor pads have exposed surfaces exposed from a surface of the insulating layer on the opposite side with respect to the base substrate, and a second build-up layer including an insulating layer and second conductor pads such that the insulating layer is formed on an active surface side of the semiconductor element and that the second conductor pads have exposed surfaces exposed from a surface of the insulating layer on the opposite side with respect to the base substrate. The insulating layer in the first build-up layer includes a resin material and a reinforcing material, the insulating layer in the second build-up layer includes a resin material and a reinforcing material, and the first conductor pads is embedded in the insulating layer in the first build-up layer.

According to one aspect of the present invention, a method for manufacturing a wiring board having a built-in semiconductor element includes forming, on a support plate, a first build-up layer including an insulating layer and first conductor pads such that the first conductor pads are formed on the support plate and embedded in the insulating layer, forming a base substrate on the first build-up layer such that a semiconductor element is embedded in the base substrate and has a non-active surface side facing the first build-up layer, forming, on the base substrate, a second build-up layer including an insulating layer and second conductor pads such that the semiconductor element has a non-active surface facing the second build-up layer, and removing the support plate from the first build-up layer such that the first conductor pads have exposed surfaces exposed from a surface of the insulating layer on the opposite side with respect to the base substrate. The insulating layer in the first build-up layer includes a resin material and a reinforcing material in the resin material, and the insulating layer in the second build-up layer includes a resin material and a reinforcing material in the resin material.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 7A to 7F are process diagrams describing the method for manufacturing the semiconductor element built-in wiring board;

FIG. 8A to 8F are process diagrams describing the method for manufacturing the semiconductor element built-in wiring board;

DETAILED DESCRIPTION OF THE EMBODIMENTS

Figure 1:
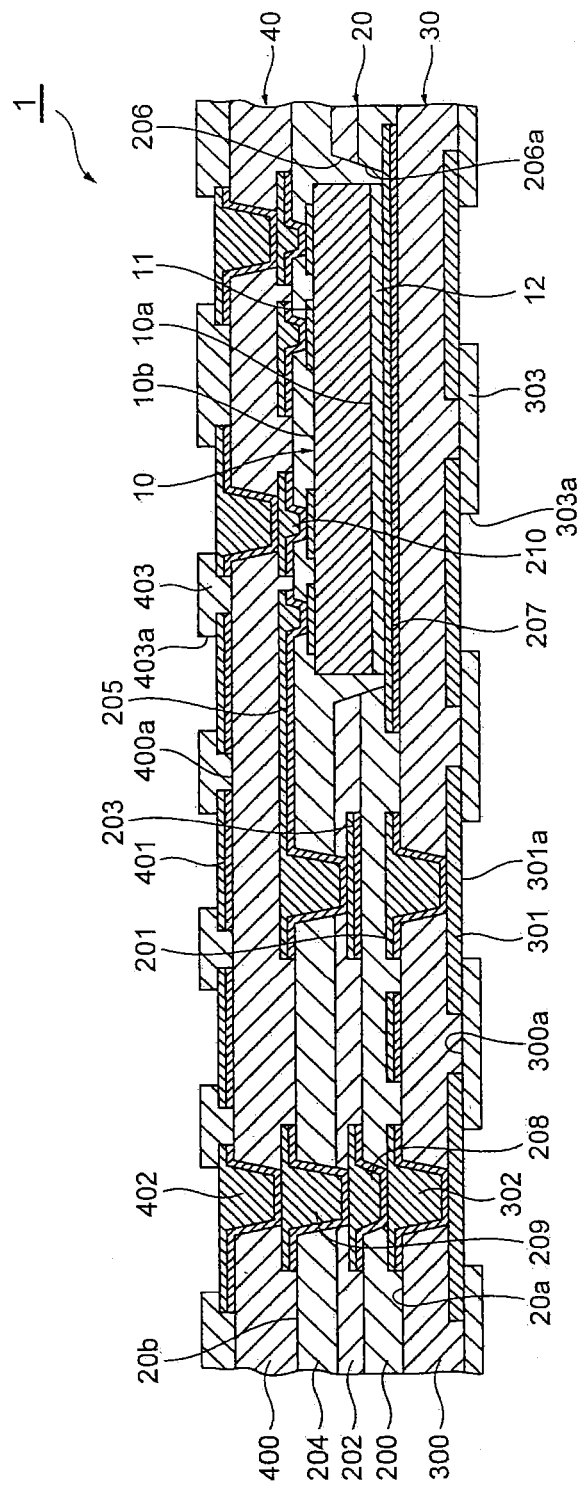
FIG. 1 is a cross-sectional view illustrating a semiconductor element built-in wiring board according to a first embodiment.

The embodiments will now be described with reference to the accompanying drawings, wherein like reference numerals designate corresponding or identical elements throughout the various drawings.

First Embodiment

As illustrated in FIG. 1, a semiconductor element built-in wiring board 1 according to the present embodiment includes: a base substrate 20 that is positioned at a central position; a semiconductor element 10 that is embedded inside the base substrate 20; and a first build-up layer 30 and a second build-up layer 40 that are respectively formed on an upper side and a lower side in a manner sandwiching the base substrate 20.

The base substrate 20 is a so-called coreless substrate that does not have a core substrate, and is formed by laminating multiple insulating layers and conductor layers. The base substrate 20 has a substantially flat plate-like shape, and has one main surface (20a) and another main surface (20b), the one main surface (20a) and the other main surface (20b) opposing each other. A conductor layer in the present embodiment is a wiring layer that forms an electrical circuit, and may include a conductor pad and a wiring pattern or the like or may include only a conductor pad, depending on a forming position of the conductor layer.

A conductor layer 201 and a plane layer 207 are provided on the one main surface (20a) side of the base substrate 20. The conductor layer 201 and the plane layer 207 are formed side by side on an insulating layer 300 of the first build-up layer 30 (to be described later). The conductor layer 201 corresponds to a "first conductor layer" in the claims and is formed, for example, by an electroless plating layer and an electrolytic plating layer. The plane layer 207, similar to the conductor layer 201, is formed by an electroless plating layer and an electrolytic plating layer.

As illustrated in FIG. 1, a portion of the plane layer 207, and the conductor layer 201, are covered by an insulating layer 200 that is formed on the portion of the plane layer 207 and on the conductor layer 201. The insulating layer 200 corresponds to a "third insulating layer" in the claims and is formed of a resin material that contains 30% or more by weight of an inorganic filler. In the present embodiment, the insulating layer 200 is formed of a resin insulating material that contains 30-80% by weight of an inorganic filler of $SiO_2$.

A conductor layer 203 is formed on the insulating layer 200. The conductor layer 203 corresponds to a "second conductor layer" in the claims and is formed, for example, by an electroless plating layer and an electrolytic plating layer. An insulating layer 202 is further laminated on the insulating layer 200 and the conductor layer 203. The insulating layer 202 corresponds to a "fourth insulating layer" in the claims and is formed of a resin material that contains 30% or more by weight of an inorganic filler. On the insulating layer 202, a conductor layer is not formed, and an insulating layer 204 is laminated.

As illustrated in FIG. 1, in the base substrate 20, a recess 206 is provided that penetrates the insulating layer 200 and the insulating layer 202, and uses a portion of the plane layer 207 as a bottom surface. The recess 206 is formed to have such a size that the semiconductor element 10 can be accommodated inside the recess 206. Further, a side wall (206a) of the recess 206 is formed to expand upward so as to allow the semiconductor element 10 to be smoothly mounted inside the recess 206.

The semiconductor element 10 has an active surface (10b) on which terminals 11 are formed, and has a non-active surface (10a) that is on an opposite side of the active surface (10b). The semiconductor element 10 is accommodated in the recess 206 such that the active surface (10b) of the semiconductor element 10 faces toward the other main surface (20b) side of the base substrate 20. A die attach film 12 is provided on the non-active surface (10a) of the semiconductor element 10.

In a lamination direction of the insulating layers (200, 202), a height of the insulating layer 202 is lower than that of the semiconductor element 10. In this way, for example, when the semiconductor element 10 is picked up and mounted in the recess 206 using a mounting device, interference between the mounting device and the insulating layer 202 can be prevented, and an effect is achieved that the mounting operation can be more smoothly performed. The semiconductor element 10 that is mounted in the recess 206 is temporarily fixed on the plane layer 207 via the die attach film 12 and is further embedded by the insulating layer 204 that is formed around and on the semiconductor element 10.

The insulating layer 204 corresponds to a "fifth insulating layer" in the claims and, similar to the insulating layers (200, 202), is formed of a resin material that contains 30% or more by weight of an inorganic filler. A conductor layer 205 is further formed on the insulating layer 204. The plane layer 205, similar to the conductor layers (201, 203), is formed by an electroless plating layer and an electrolytic plating layer. Further, the conductor layer 205 is divided into a part that is formed in a region above the semiconductor element 10 and a part that is formed outside the region. As illustrated in FIG. 1, a portion of one of the two parts and a portion of the other part are connected. In this way, a wiring that is formed can be utilized not only for signal transmission but also, for example, as a power source wiring or a ground wiring.

Among the insulating layers (200, 202, 204) of the base substrate 20, the insulating layer 200 is positioned on a lowermost side and the insulating layer 204 is positioned on an uppermost side. Therefore, a lower surface of the insulating layer 200 forms the one main surface (20a) of the base substrate 20, and an upper surface of the insulating layer 204 forms the other main surface (20b) of the base substrate 20. Further, lower surfaces of the conductor layer 201 and the plane layer 207 are positioned on the same plane as the one main surface (20a) of the base substrate 20.

The insulating layer 202 is different from the insulating layers (200, 204) in that a conductor layer is not formed on the insulating layer 202. When the plane layer 207 is subjected to a desmear treatment, which is performed after the recess 206 is formed, the insulating layer 202 prevents an influence by the desmear treatment on the conductor layer 203. The insulating layer 202 is provided as a protective layer that protects the conductor layer 203. Further, among the insulating layers (200, 202, 204) of the base substrate 20, the insulating layer 202 is the thinnest. In this way, reduction in a thickness of the base substrate 20 can be achieved.

Via conductors 208 that electrically connect the conductor layer 201 and the conductor layer 203 are formed inside the insulating layer 200. Via conductors 209 that electrically connect the conductor layer 203 and the conductor layer 205 are formed inside the insulating layers (202, 204). That is, the via conductors 208 are formed over one insulating layer, whereas the via conductors 209 are formed over two insulating layers.

Further, via conductors 210 that electrically connect the terminals 11 of the semiconductor element 10 and the conductor layer 205 are formed inside the insulating layer 204 that is positioned above on the semiconductor element 10. The via conductors (208, 209, 210) have truncated cone shapes that increase in diameter toward the same direction. Specifically, all of the via conductors (208, 209, 210) are formed such that their diameters are enlarged along a direction from the one main surface (20a) toward the other main surface (20b).

The first build-up layer 30 includes the insulating layer 300 that is formed below the one main surface (20a) of the base substrate 20 on the non-active surface (10a) side of the semiconductor element 10, and conductor pads 301 that are formed on the insulating layer 300. The insulating layer 300 corresponds to a "first insulating layer" in the claims, and is formed of a resin material that contains a reinforcing material. Here, the reinforcing material is at least one selected from the group of a glass cloth, a carbon fiber, a glass nonwoven fabric, an aramid cloth and an aramid nonwoven fabric. In the present embodiment, the insulating layer 300 is formed of an ABF material that contains a glass cloth (product name: ABF-GX13GC, manufactured by Ajinomoto Fine-Techno Co., Ltd.).

The conductor pads 301 correspond to "first conductor pads" in the claims, and are formed, for example, by an electrolytic plating layer. The conductor pads 301 are embedded in the insulating layer 300 and are exposed to outside from a surface (300a) side of the insulating layer 300 on an opposite side of the base substrate 20 (that is, from a side distanced away from the one main surface (20a) of the base substrate 20). Surfaces (301a) of the conductor pads 301 that are exposed to the outside are positioned on the same plane as the surface (300a) of the insulating layer 300 on the opposite side of the base substrate 20. For example, when the semiconductor element built-in wiring board 1 is mounted on another printed wiring board including a motherboard or the like, the conductor pads 301 are electrically connected via solder bumps to connection pads of the other printed wiring board including a motherboard or the like. Further, via conductors 302 that electrically connect the conductor pads 301 and the conductor layer 201 (which is positioned on a lowermost side of the base substrate 20) are formed inside the insulating layer 300.

The second build-up layer 40 includes an insulating layer 400 that is formed on the other main surface (20b) of the base substrate 20 on the active surface (10b) side of the semiconductor element 10, and conductor pads 401 that are formed on the insulating layer 400. The insulating layer 400 corresponds to a "second insulating layer" in the claims and, similar to the insulating layer 300, is formed of a resin material that contains a reinforcing material. In the present embodiment, the insulating layer 400 is formed of an ABF material that contains a glass cloth (product name: ABF-GX13GC, manufactured by Ajinomoto Fine-Techno Co., Ltd.).

The conductor pads 401 correspond to "second conductor pads" in the claims, and are formed, for example, by an electroless plating layer and an electrolytic plating layer. The conductor pads 401 are formed on the insulating layer 400 and are exposed to outside from a surface (400a) side of the insulating layer 400 on an opposite side of the base substrate 20 (that is, from a side distanced away from the other main surface (20b) of the base substrate 20). For example, when an external electronic component such as a chip or a printed wiring board is mounted, the conductor pads 401 are electrically connected via solder bumps to connection terminals or the like of the external electronic component. Further, via conductors 402 that electrically connect the conductor pads 401 and the conductor layer 205 (which is positioned on an uppermost side of the base substrate 20) are formed inside the insulating layer 400.

The via conductors 302 of the first build-up layer 30 and the via conductors 402 of the second build-up layer 40 have truncated cone shapes that increase in diameter toward the same direction. Specifically, all of the via conductors (302, 402) are formed such that their diameters are enlarged along a direction from the one main surface (20a) toward the other main surface (20b).

As illustrated in FIG. 1, among the via conductors (208, 209) of the base substrate 20, the via conductors 302 of the first build-up layer 30 and the via conductors 402 of the second build-up layer 40, some are linearly stacked along the lamination direction and form stack via structures. As a result, the conductor pads 301 of the first build-up layer 30 are electrically connected to the conductor pads 401 of the second build-up layer 40 via the via conductors (302, 208, 209, 402) and the conductor layers (201, 203, 205). Further, although not illustrated in the drawings, among the via conductors (208, 209) of the base substrate 20, the via conductors 302 of the first build-up layer 30 and the via conductors 402 of the second build-up layer 40, some are stacked along the lamination direction with their positions shifted with respect to each other and form offset via structures.

A solder resist layer (first solder resist layer) 303 having openings (303a) that each expose a portion of a conductor pad 301 is formed on the surface (300a) of the insulating layer 300 on an opposite side of the base substrate 20. Similarly, a solder resist layer (second solder resist layer) 403 having openings (403a) that each expose a portion of a conductor pad 401 is formed on the surface (400a) of the insulating layer 400 on an opposite side of the base substrate 20. In this way, an effect is achieved that a surface of the semiconductor element built-in wiring board 1 can be protected, solder can be prevented from being attached to a portion where solder is not required during mounting, and mounting reliability can be improved. When desired, it is also possible that, on the surface (300a) of the insulating layer 300 on the opposite side of the base substrate 20, for example, only a processing film such as an OSP (Organic Solderability Preservative) film is formed and the first solder resist layer 303 is not formed.

In the semiconductor element built-in wiring board 1 having the above-described structure, the insulating layer 300 and the insulating layer 400 are formed of a resin material that contains a reinforcing material and thus can enhance strength of the base substrate 20 that is sandwiched between the insulating layer 300 and the insulating layer 400. As a result, occurrence of warpage due to a difference in thermal expansion coefficient between the materials can be prevented. Therefore, for example, based on a warpage occurrence prediction situation of the base substrate 20, occurrence of warpage in the semiconductor element built-in wiring board 1 can be prevented by changing the kind of the resin material containing a reinforcing material that is used for the insulating layer 300 and the insulating layer 400 formed on both sides of the base substrate 20, or by adjusting thicknesses of the insulating layer 300 and the insulating layer 400. For example, when it is predicted that warpage of the base substrate 20 is larger on the other main surface (20b) than on the one main surface (20a) side, by using a material having a higher strength for the insulating layer 400 positioned on the other main surface (20b) side than that of the material used for the insulating layer 300 positioned on the one main surface (20a) side, occurrence of warpage can be reliably prevented.

Further, the first build-up layer 30 is formed on the non-active surface (10a) side of the semiconductor element 10 and the conductor pads 301 are embedded in the insulating layer 300. Therefore, as compared to a case where the conductor pads are not embedded in the insulating layer, a distance between each of the conductor pads 301 and the semiconductor element 10 can be reduced. Therefore, an effect of releasing heat generated from the semiconductor element 10 to outside can be enhanced. Further, by embedding the conductor pads 301 in the insulating layer 300, peeling of the conductor pads 301 can be suppressed.

Further, the surfaces (301a) of the conductor pads 301 that are exposed to the outside are positioned on the same plane as the surface (300a) of the insulating layer 300 on the opposite side of the base substrate 20. Therefore, flatness of the surface (300a) can be maintained and, when the semiconductor element built-in wiring board 1 is mounted via the surface (300a) to another printed wiring board including a motherboard or the like, improvement in mountability can be achieved. In addition, the surfaces (301a) of the conductor pads 301 that are exposed to the outside are positioned on the same plane as the surface (300a). Therefore, by utilizing a self-alignment effect, occurrence of solder bridging during mounting can be prevented.

Further, among the via conductors (208, 209) of the base substrate 20, the via conductors 302 of the first build-up layer 30 and the via conductors 402 of the second build-up layer 40, some are linearly stacked along the lamination direction and form stack via structures. Therefore, as compared to a case where offset via structures are adopted, reduction in a thickness of the semiconductor element built-in wiring board 1 can be easily achieved, and improvement in design flexibility of the semiconductor element built-in wiring board 1 can be achieved.

In the following, with reference to FIGS. 2 and 3, a semiconductor package of a POP (package on package) structure that uses the semiconductor element built-in wiring board 1 is described.

Figure 2:
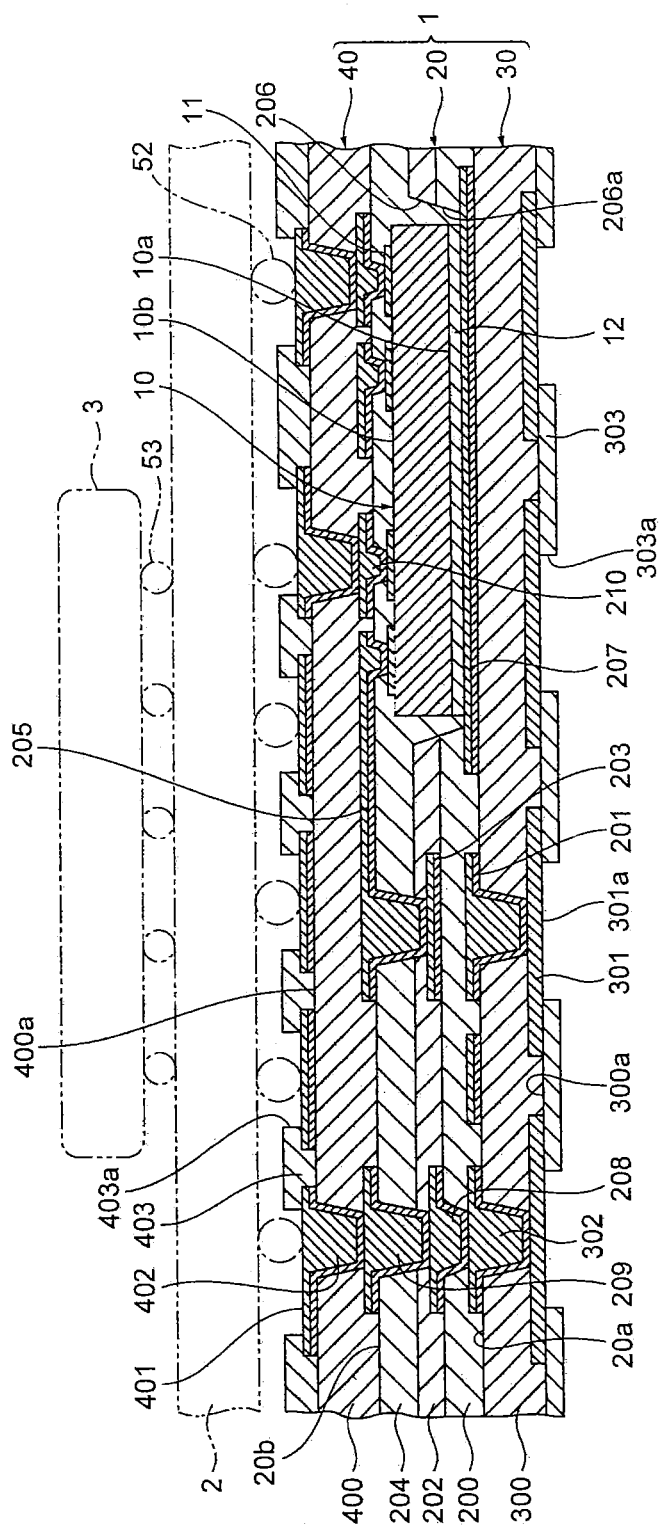
FIG. 2 is an explanatory diagram illustrating a semiconductor package of a POP structure that uses the semiconductor element built-in wiring board.

In a semiconductor package illustrated in FIG. 2, a printed wiring board 2 is mounted on the second build-up layer 40 side of the semiconductor element built-in wiring board 1. Electrodes or terminals of the printed wiring board 2 are electrically connected via solder bumps 52 to the conductor pads 401 of the second build-up layer 40. A chip 3 is further mounted on the printed wiring board 2. Electrodes or terminals of the chip 3 are electrically connected via solder bumps 53 to electrodes or terminals of the printed wiring board 2.

Figure 3:
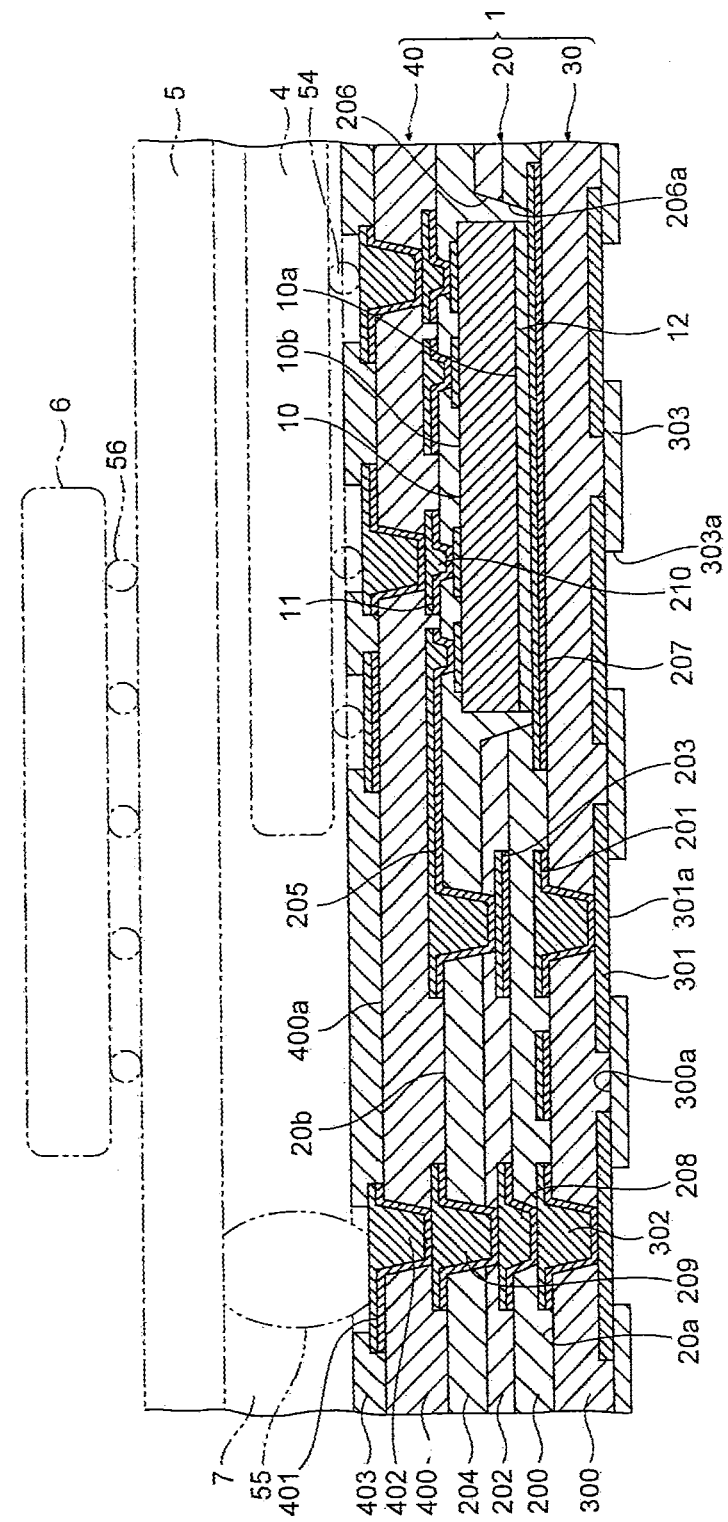
FIG. 3 is an explanatory diagram illustrating a semiconductor package of a POP structure that uses the semiconductor element built-in wiring board.

In a semiconductor package illustrated in FIG. 3, a chip 4 and a printed wiring board 5 are mounted on the second build-up layer 40 side of the semiconductor element built-in wiring board 1. The chip 4 and the printed wiring board 5 are positioned to be stacked in an up-down direction (that is, the lamination direction of the insulating layers (200, 202)). Terminals or electrodes of the chip 4 are electrically connected via solder bumps 54 to some of the conductor pads 401 of the second build-up layer 40. The printed wiring board 5 is positioned above the chip 4. Terminals or electrodes of the printed wiring board 5 are electrically connected via solder bumps 55 to some of the conductor pads 401 of the second build-up layer 40.

A mold resin layer 7 is formed between the chip 4 and the printed wiring board 5. The chip 4 is sealed inside the mold resin layer 7. A chip 6 is further mounted on the printed wiring board 5. Electrodes or terminals of the chip 6 are electrically connected via solder bumps 56 to electrodes or terminals of the printed wiring board 5.

Second Embodiment

Figure 4:
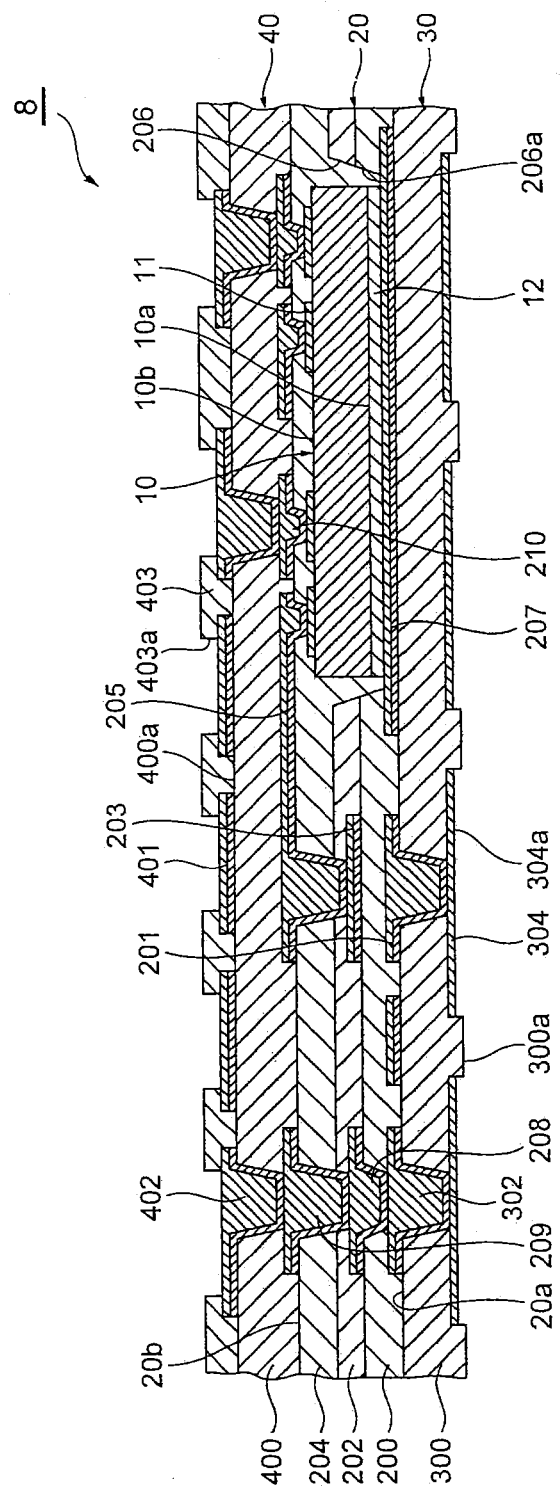
FIG. 4 is a cross-sectional view illustrating a semiconductor element built-in wiring board according to a second embodiment.

In the following, with reference to FIG. 4, a second embodiment of the present invention is described. A semiconductor element built-in wiring board 8 according to the present embodiment is different from the first embodiment in that surfaces (304a) of conductor pads 304 that exposed to outside are recessed relative to the surface (300a) of the insulating layer 300 on the opposite side of the base substrate 20. Other structures are the same as the first embodiment.

The conductor pads 304 correspond to "first conductor pads" in the claims, and are formed, for example, by an electrolytic plating layer. The conductor pads 304 are embedded in the insulating layer 300 and are exposed to outside from the surface (300a) of the insulating layer 300 on the opposite side of the base substrate 20. The surfaces (304a) of the conductor pads 304 that are exposed to the outside are recessed to an inner side of the semiconductor element built-in wiring board 8 relative to the surface (300a) of the insulating layer 300 on the opposite side of the base substrate 20. Preferably, the surfaces (304a) are recessed 3-15 µm relative to the surface (300a) of the insulating layer 300 on the opposite side of the base substrate 20. A solder resist layer is not formed on the surface (300a) of the insulating layer 300 on the opposite side of the base substrate 20.

The following is an example of a method that allows the surfaces (304a) of the conductor pads 304 to be recessed to the inner side of the semiconductor element built-in wiring board 8 relative to the surface (300a) of the insulating layer 300 on the opposite side of the base substrate 20. That is, the conductor pads 304 are first formed from electrolytic Cu/Ni/Cu plating layers. Thereafter, the Cu plating layer of the conductor pads 304 on the outermost side (side close to the surface (300a) of the insulating layer 300 on the opposite side of the base substrate 20) is removed by an etching process. In this case, the Ni plating layer prevents erosion of the inner side Cu plating layer due to the etching process, and thus only the outer side Cu plating layer is removed. As a result, recesses occur.

In the semiconductor element built-in wiring board 8 according to the present embodiment, the same operation effect as in the first embodiment can be obtained. In addition, since the surfaces (304a) of the conductor pads 304 that are exposed to the outside are recessed relative to the surface (300a) of the insulating layer 300 on the opposite side of the base substrate 20, during mounting, a solder bump can be reliably prevented from flowing to an adjacent conductor pad, and improvement in mountability can be achieved.

Third Embodiment

Figure 5:
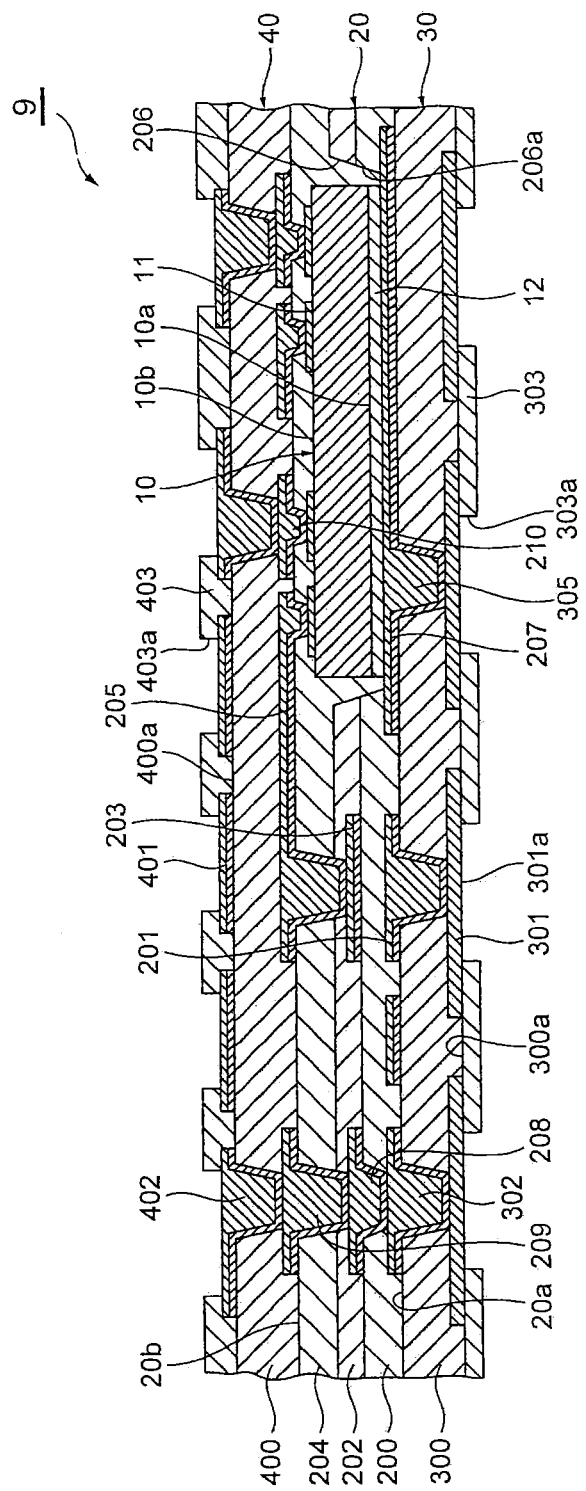
FIG. 5 is a cross-sectional view illustrating a semiconductor element built-in wiring board according to a third embodiment.

In the following, with reference to FIG. 5, a third embodiment of the present invention is described. A semiconductor element built-in wiring board 9 according the present embodiment is different from the first embodiment in that a via conductor 305 that electrically connects the plane layer 207 and a conductor pad 301 is provided. Other structures are the same as the first embodiment.

Specifically, inside the insulating layer 300, in addition to the via conductors 302 that electrically connect the conductor pads 301 and the conductor layer 201 of the base substrate 20, a via conductor 305 that electrically connects a conductor pad 301 and the plane layer 207 of the base substrate 20 is further formed. Similar to the via conductors 302, the via conductor 305 has a truncated cone shape that increases in diameter in a direction from the one main surface (20a) toward the other main surface (20b). Depending in an area of the plane layer 207 and an area of a conductor pad 301, one or more via conductors 305 may be provided.

In the semiconductor element built-in wiring board 9 according to the present embodiment, the same operation effect as in the first embodiment can be obtained. In addition, since the via conductor 305 that electrically connects the plane layer 207 and a conductor pad 301 is provided, via the via conductor 305, heat generated from the semiconductor element 10 can be efficiently transmitted to the conductor pad 301 and released to the outside, and occurrence of a thermal stress can be suppressed. Further, by connecting to a ground layer via the via conductor 305, noise can be reduced.

Method for Manufacturing Semiconductor Element Built-In Wiring Board

In the following, with reference to FIGS. 6A-10D, a method for manufacturing the semiconductor element built-in wiring board 1 is described. The method for manufacturing the semiconductor element built-in wiring board 1 according to the present embodiment includes a first process in which the first build-up layer 30 is formed on a support plate 50, a second process in which the base substrate 20 is formed and the semiconductor element 10 is embedded inside the base substrate 20, a third process in which the second build-up layer 40 is formed on the base substrate 20, and a fourth process in which the support plate 50 is removed.

First Process

Figure 6A:
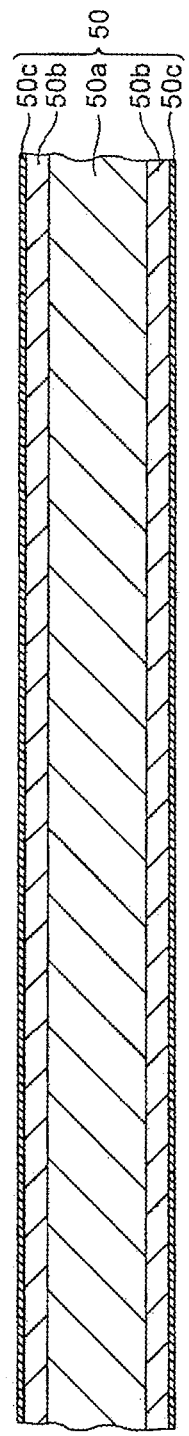
FIG. 6A to 6C are process diagrams describing a method for manufacturing the semiconductor element built-in wiring board.

First, the support plate 50 is prepared (see FIG. 6A). A copper-clad laminated plate is used for the support plate 50. The copper-clad laminated plate is formed by an insulating layer (50a), a first copper foil (50b) that is laminated on both sides of the insulating layer (50a), and a second copper foil (50c) that is laminated on an outer side of the first copper foil (50b). The first copper foil (50b) has a thickness of 15-20 µm, and the second copper foil (50c) has a thickness of 3-5 µm. A release layer (not illustrated in the drawings) is formed between the first copper foil (50b) and the second copper foil (50c).

Figure 6B:
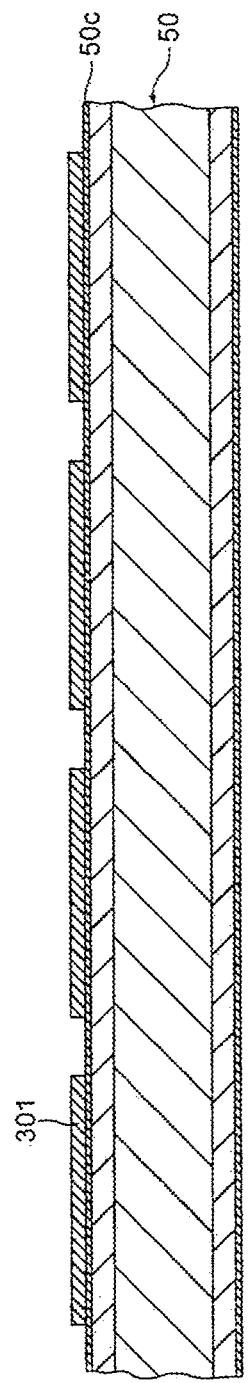
Figure 6C:
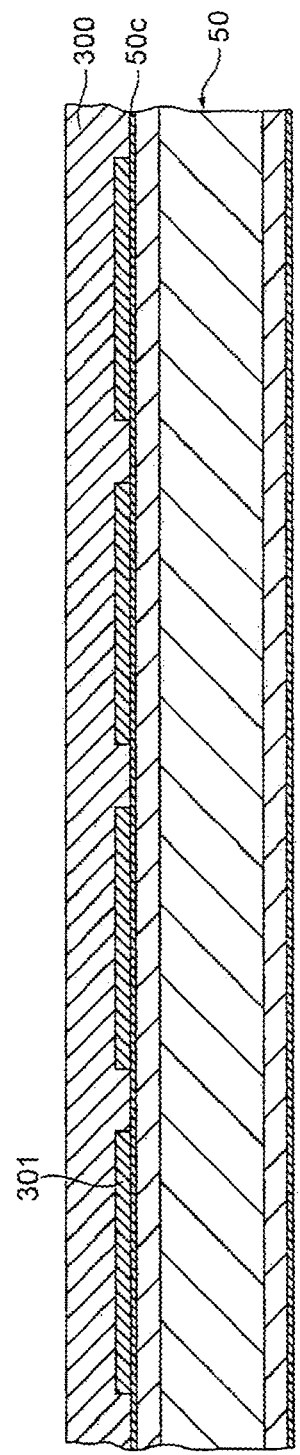

Next, the conductor pads 301 are formed on the second copper foil (50c) (see FIG. 6B). Specifically, first, a photosensitive resist layer is applied on the second copper foil (50c). Thereafter, by performing exposure processing and development processing, a predetermined resist pattern is formed. Next, on the second copper foil (50c) where the resist pattern is not formed, the conductor pads 301 are formed by electrolytic plating. Next, the resist pattern is removed, and the insulating layer 300 is laminated on the second copper foil (50c) and on the conductor pads 301 (see FIG. 6C). As a result, the conductor pads 301 are embedded in the insulating layer 300. The ABF material that contains a glass cloth (product name: ABF-GX13GC, manufactured by Ajinomoto Fine-Techno Co., Ltd.) is used for the insulating layer 300.

Second Process

Figure 7A:
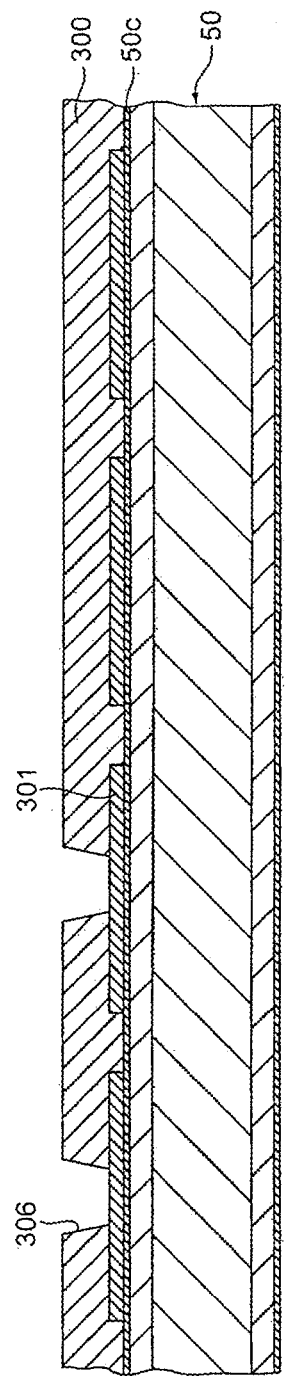
Figure 7B:
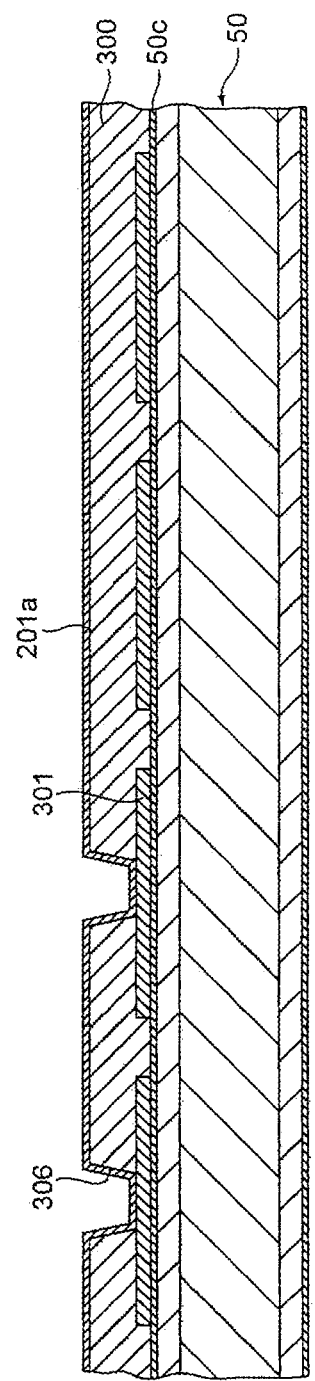
Figure 7D:
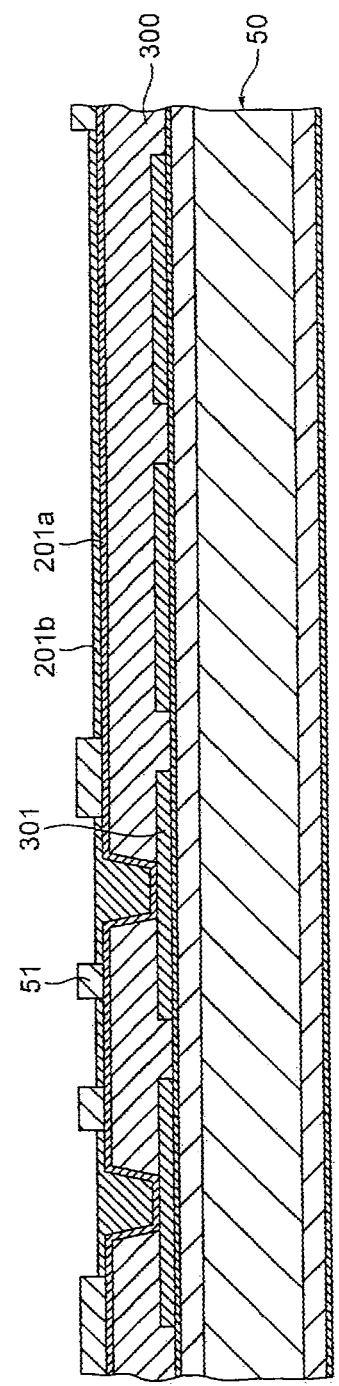
Figure 7E:
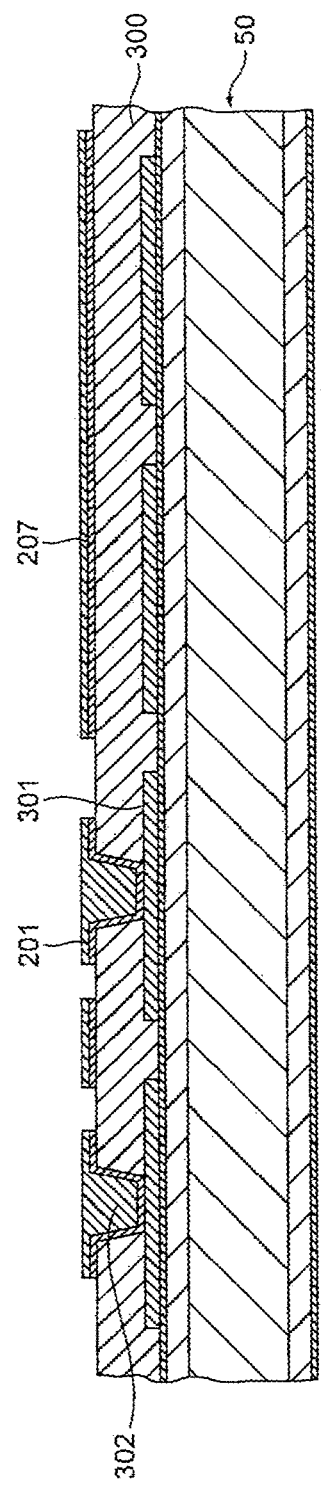

Via holes 306 are formed by laser processing at predetermined positions in the insulating layer 300 (see FIG. 7A). In this case, the via holes 306 are formed to each have a truncated cone shape that increases in diameter along a direction away from the support plate 50. As a result, the formed via conductors increase in diameter in the direction away from the support plate 50. Further, the via holes 306 are formed to have a depth such that the via holes 306 reach the surfaces of the conductor pads 301.

An upper surface of the insulating layer 300 and inner walls and bottom surfaces of the via holes 306 are subjected to a desmear treatment. Thereafter, a seed layer (201a) is formed using an electroless plating method (see FIG. 7B). Here, instead of the electroless plating method, it is also possible to use a sputtering method to form the seed layer. As a material of the seed layer (201a), for example, titanium, titanium nitride, chromium, copper, or the like, can be used.

A predetermined resist pattern 51 is formed on the seed layer (201a) (see FIG. 7C). Specifically, a photosensitive resist layer is applied on the seed layer (201a). Thereafter, by performing exposure processing and development processing, a predetermined resist pattern 51 is formed. Next, a copper plating layer (201b) is formed on the seed layer (201a) where the resist pattern 51 is not formed (see FIG. 7D). The copper plating layer (201b) may also be a layer that is formed by laminating an electroless plating layer or by laminating an electrolytic plating layer or by laminating an electroless plating layer and an electrolytic plating layer.

The predetermined resist pattern 51 that is formed on the seed layer (201a) is removed. Next, a portion of the seed layer (201a) that is exposed to the outside due to the removal of the resist pattern 51 is etched and removed. Of the seed layer (201a) and the copper plating layer (201b) that are remaining on the insulating layer 300, a portion forms the plane layer 207 and the rest forms the conductor layer 201. Therefore, the plane layer 207 and the conductor layer 201 are in a state of being formed side by side on the insulating layer 300. Further, due to the formation of the copper plating layer (201b), copper is filled in the via holes 306. The via conductors 302 are formed by the filled copper and the seed layer (201a) formed on the inner walls and bottom surfaces of the via holes 306 (see FIG. 7E).

Figure 7F:
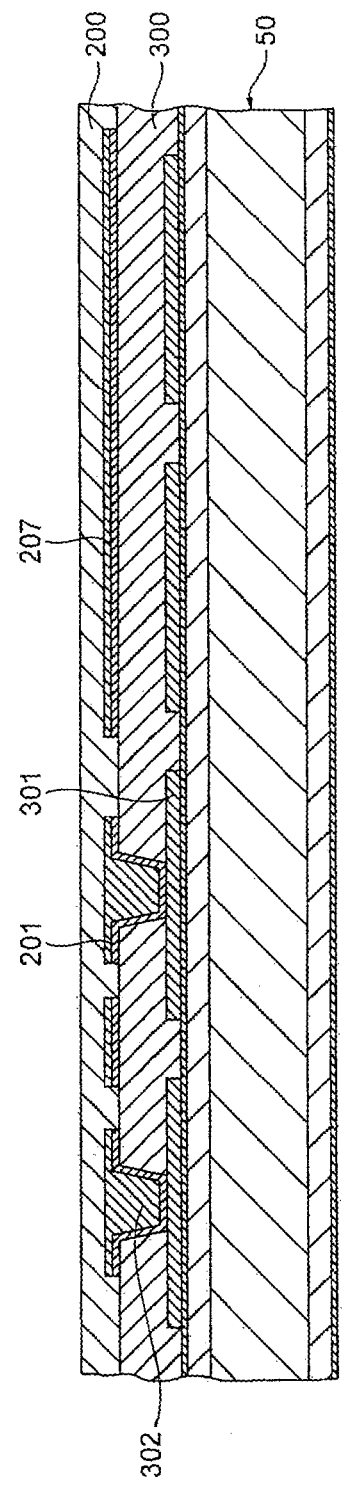

The insulating layer 200 is laminated on the insulating layer 300 and the conductor layer 201 (see FIG. 7F). A resin material that contains, for example, 30% or more by weight of an inorganic filler is used for the insulating layer 200. Next, via holes (200a) are formed by laser processing at predetermined positions in the insulating layer 200 (see FIG. 8A). Next, using the above-described method, the conductor layer 203 is formed on the insulating layer 200, and the via conductors 208 are formed inside the via holes (200a) (see FIG. 8B).

Figure 8A:
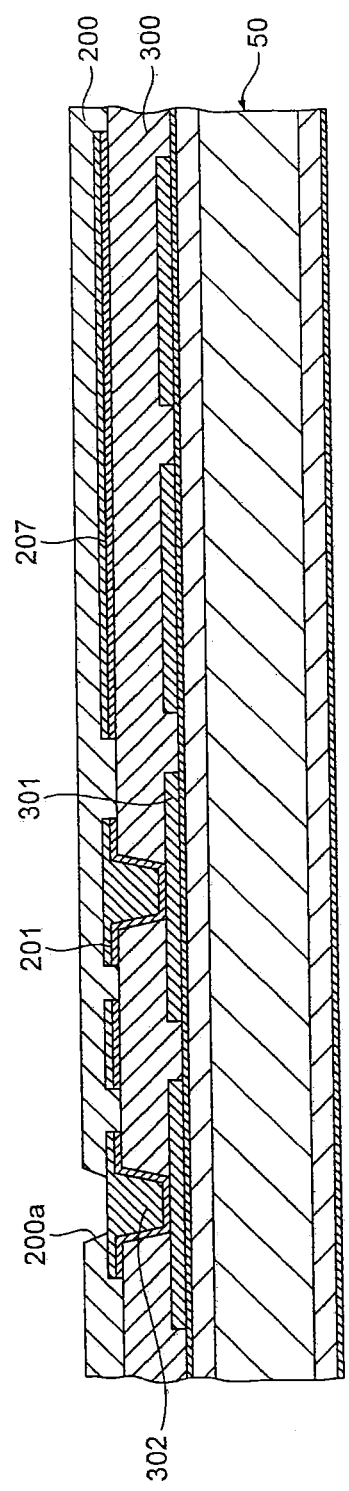
Figure 8C:
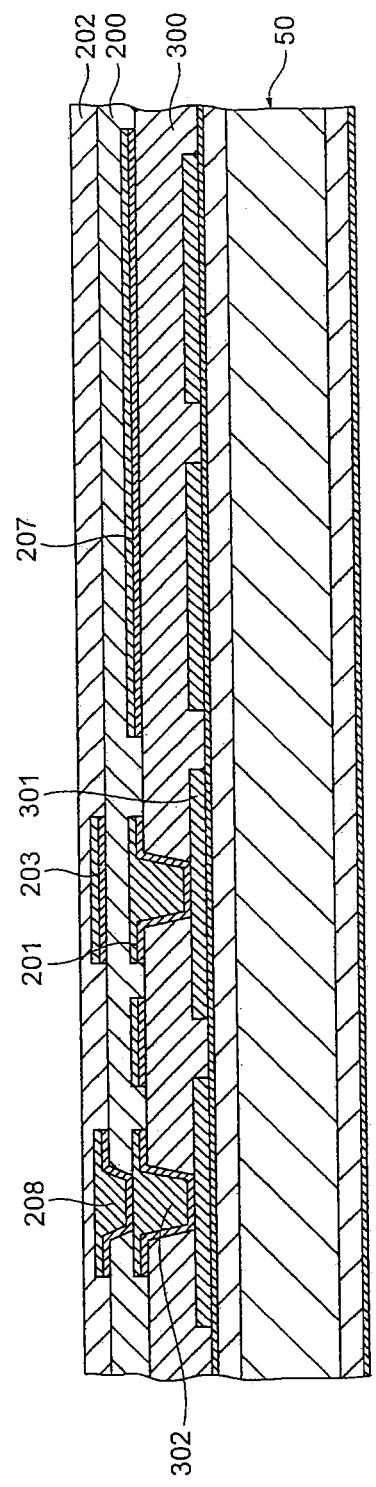

The insulating layer 202 is laminated on the insulating layer 200 and the conductor layer 203 (see FIG. 8C). In this case, taking into account of allowing the mounting operation of the semiconductor element 10 (to be described later) to be smoothly performed, the height of the insulating layer 202 is lower than the height of the semiconductor element 10. Similar to the insulating layer 200, a resin material that contains 30% or more by weight of an inorganic filler is used for the insulating layer 202. In order to reduce the thickness of the base substrate 20, the insulating layer 202 is formed thinner than all of the insulating layer 200 and the insulating layer 204 (to be described later).

Figure 8D:
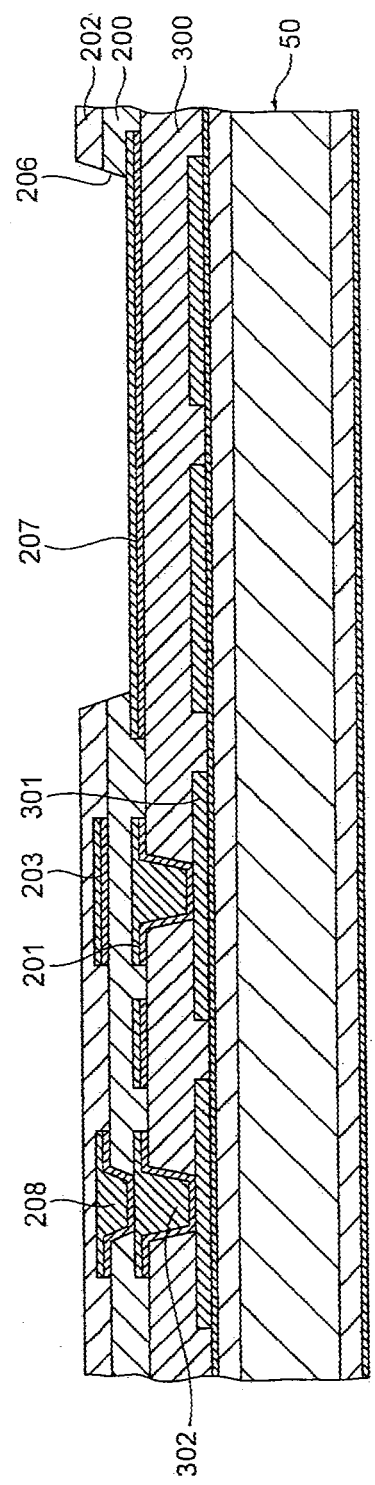

Laser is irradiated to a predetermined position on the insulating layer 202, and the recess 206 is formed that penetrates the insulating layer 202 and the insulating layer 200 positioned below the insulating layer 202 and exposes a portion of the upper surface of the plane layer 207 as a bottom surface (see FIG. 8D). Here, a bottom surface area of the formed recess 206 is smaller than an area of the plane layer 207. The entire bottom surface of the recess 206 is formed by only the plane layer 207.

Of the plane layer 207, the portion that is exposed as the bottom surface of the recess 206 is subjected to a desmear treatment. As a result, resin residues of the insulating layers (200, 202) attached to the surface of the exposed portion of the plane layer 207 are removed. In the present embodiment, the insulating layer 202 is formed on the conductor layer 203. Therefore, when the plane layer 207 is subjected to the desmear treatment, an influence by the desmear treatment on the conductor layer 203 can be prevented. That is, the insulating layer 202 functions as a protective layer that protects the conductor layer 203.

Figure 8E:
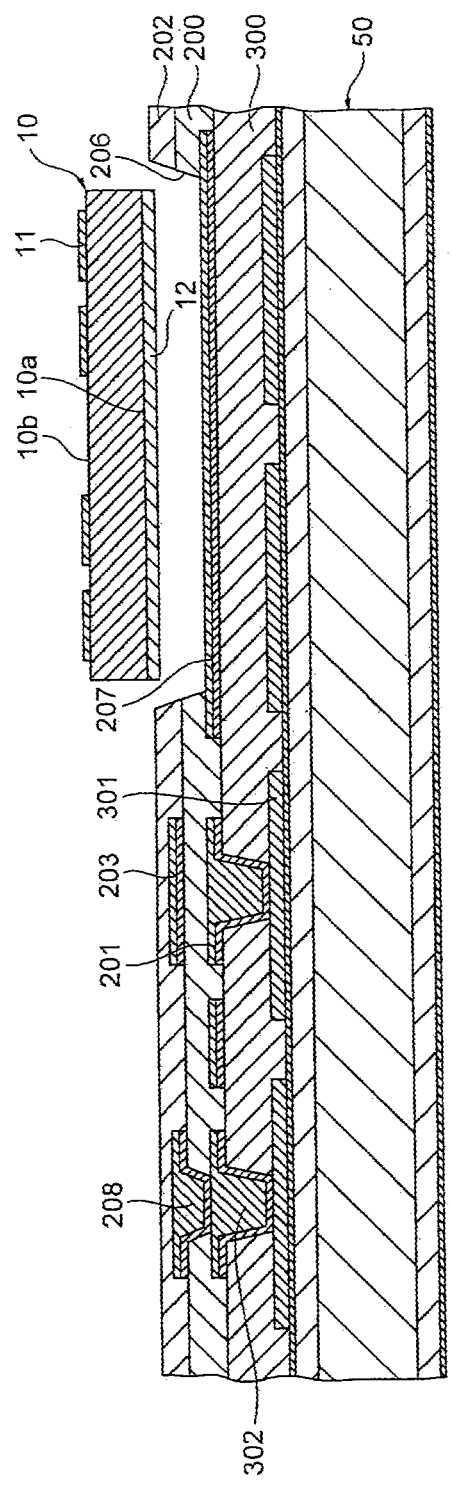
Figure 8F:
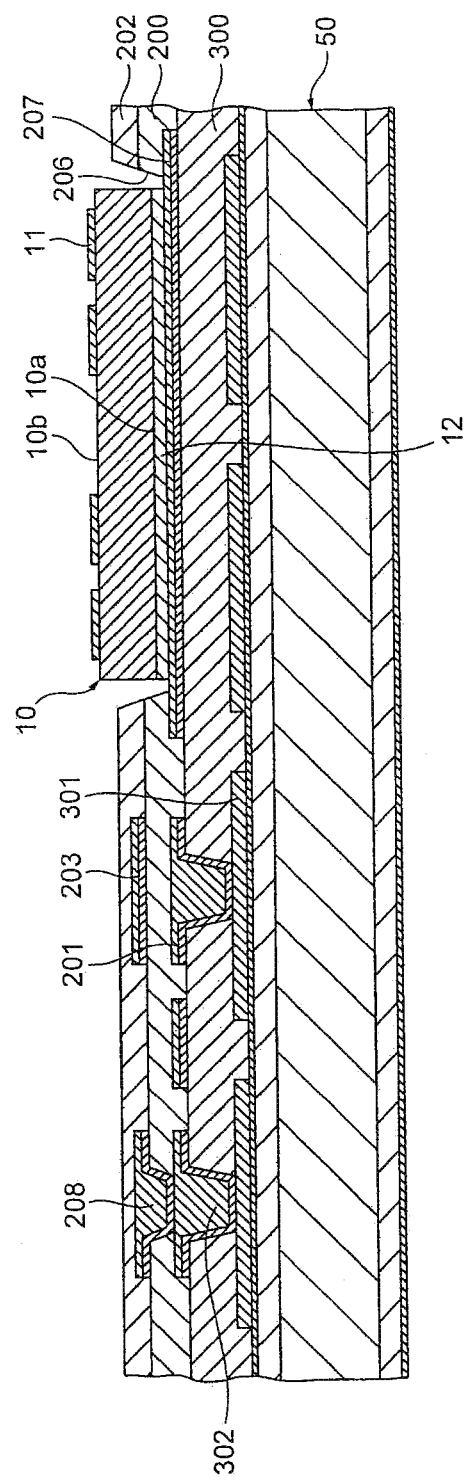

The semiconductor element 10, which is prepared in advance, is mounted in the recess 206 (see FIG. 8E). For example, the semiconductor element 10 is picked up using a mounting device, and is mounted on the bottom surface of the recess 206 such that the non-active surface (10a) faces downward. As described above, the height of the insulating layer 202 is lower than the height of the semiconductor element 10. Therefore, when the semiconductor element 10 is mounted in the recess 206 using a mounting device, interference between the mounting device and the insulating layer 202 can be prevented, and the mounting operation can be smoothly performed.

The die attach film 12 is provided on the non-active surface (10a) of the semiconductor element 10. After the semiconductor element 10 is mounted, the die attach film 12 is heated and cured and thereby the semiconductor element 10 is temporarily fixed on the plane layer 207 (see FIG. 8F).

Figure 9A:
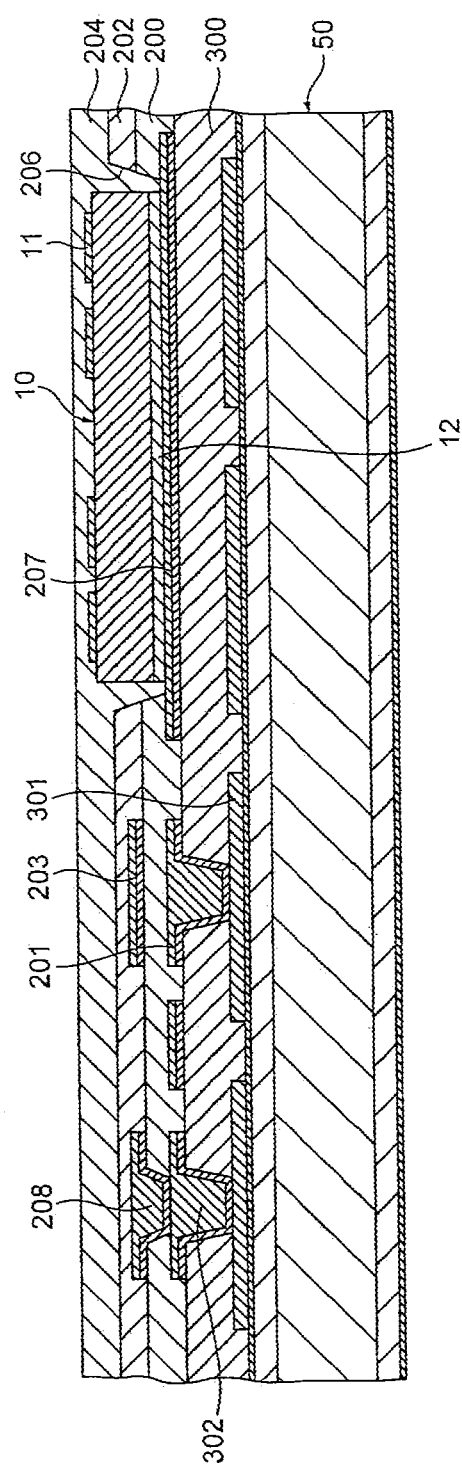
FIG. 9A to 9E are process diagrams describing the method for manufacturing the semiconductor element built-in wiring board.
Figure 9B:
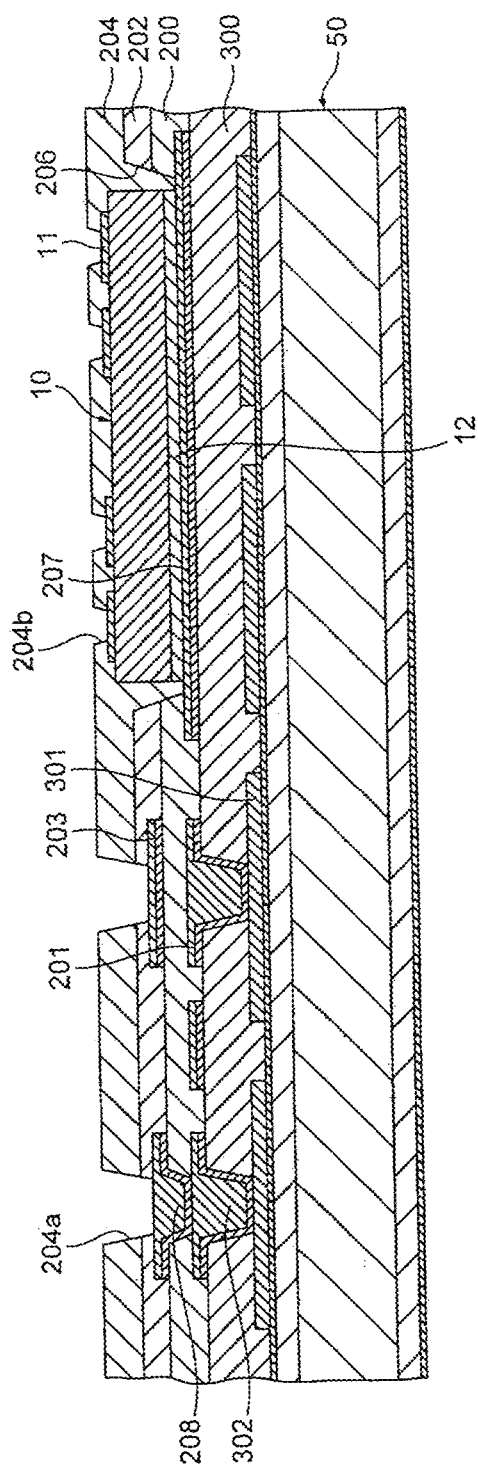

The insulating layer 204 is laminated on the insulating layer 202 and the semiconductor element 10 (see FIG. 9A). As a result, the semiconductor element 10 is sealed in the insulating layer 204. Similar to the insulating layers (200, 202), a resin material that contains 30% or more by weight of an inorganic filler is used for the insulating layer 204. Next, by laser processing, via holes (204a) are formed at predetermined positions in the insulating layer 202 and the insulating layer 204 that cover the conductor layer 203, and via holes (204b) are formed at predetermined positions in the insulating layer 204 that covers the semiconductor element 10 (see FIG. 9B). The via holes (204a) penetrate the insulating layer 204 and the insulating layer 202, and are formed to have a depth such that the via holes (204a) reach the surface of the conductor layer 203. The via holes (204b) are formed to have a depth such that the via holes (204b) reach surfaces of the terminals 11 of the semiconductor element 10.

Figure 9C:
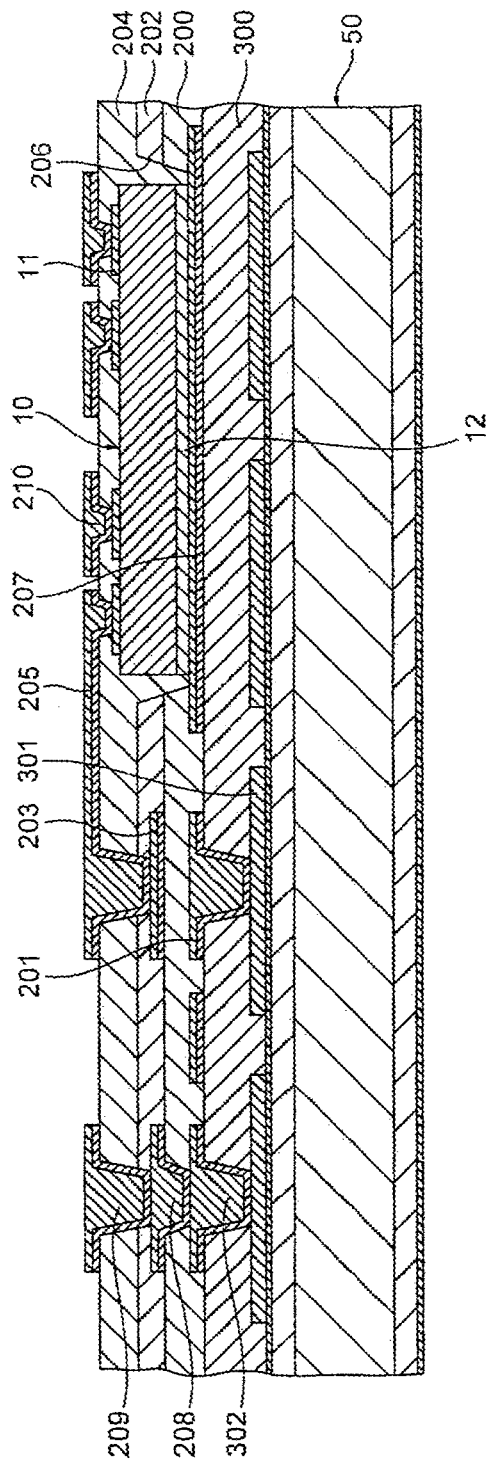
Figure 9D:
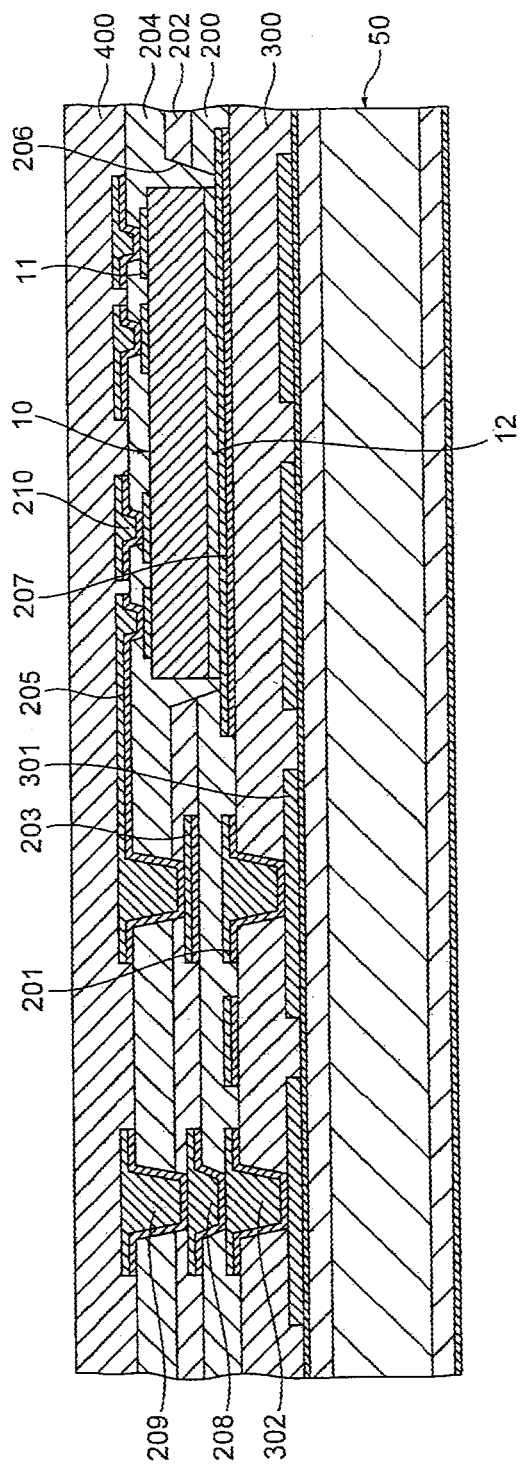

Using the above-described method, the conductor layer 205 is formed on the insulating layer 204; the via conductors 209 are formed inside the via holes (204a); and the via conductors 210 are formed inside the via holes (204b) (see FIG. 9C). Next, the insulating layer 400 is laminated on the insulating layer 204 and the conductor layer 205 (see FIG. 9D). Similar to the insulating layer 300, the ABF material that contains a glass cloth (product name: ABF-GX13GC, manufactured by Ajinomoto Fine-Techno Co., Ltd.) is used for the insulating layer 400.

Figure 9E:
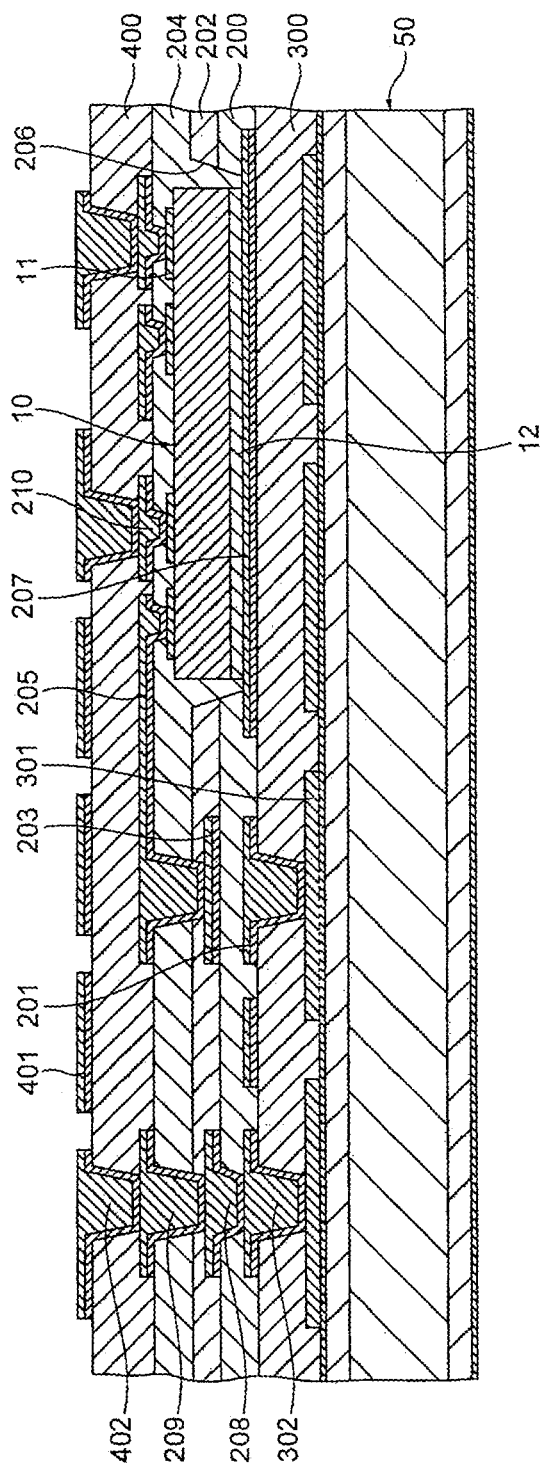
Figure 10A:
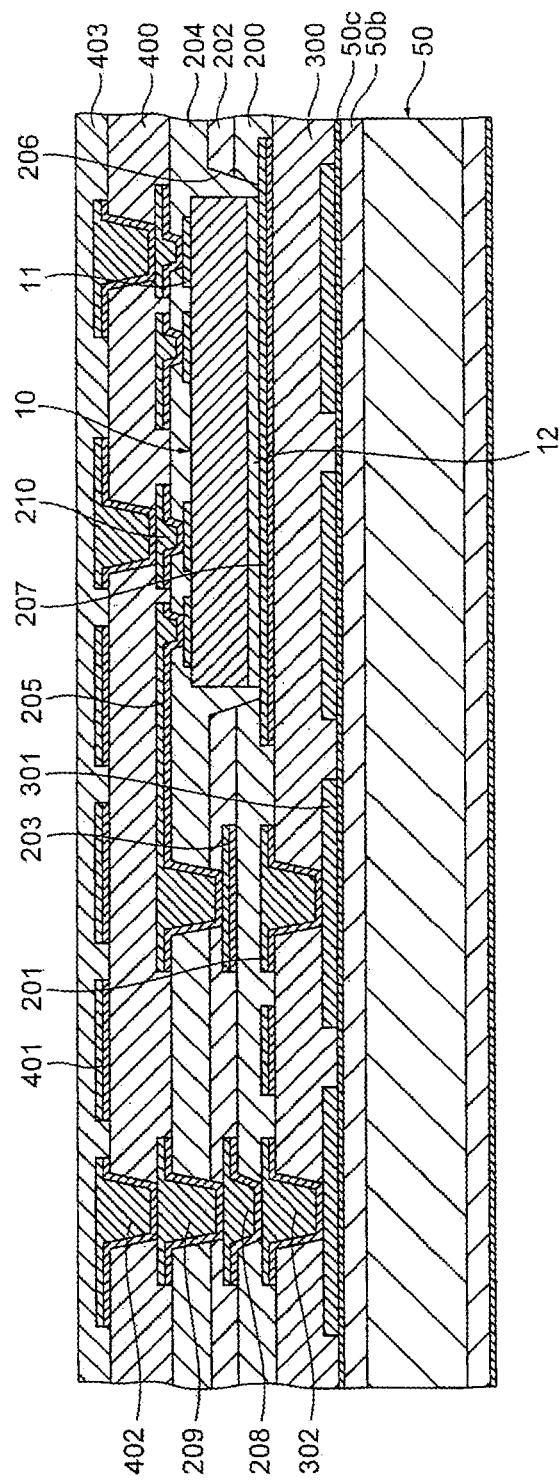
FIG. 10A to 10D are process diagrams describing the method for manufacturing the semiconductor element built-in wiring board.
Figure 10B:
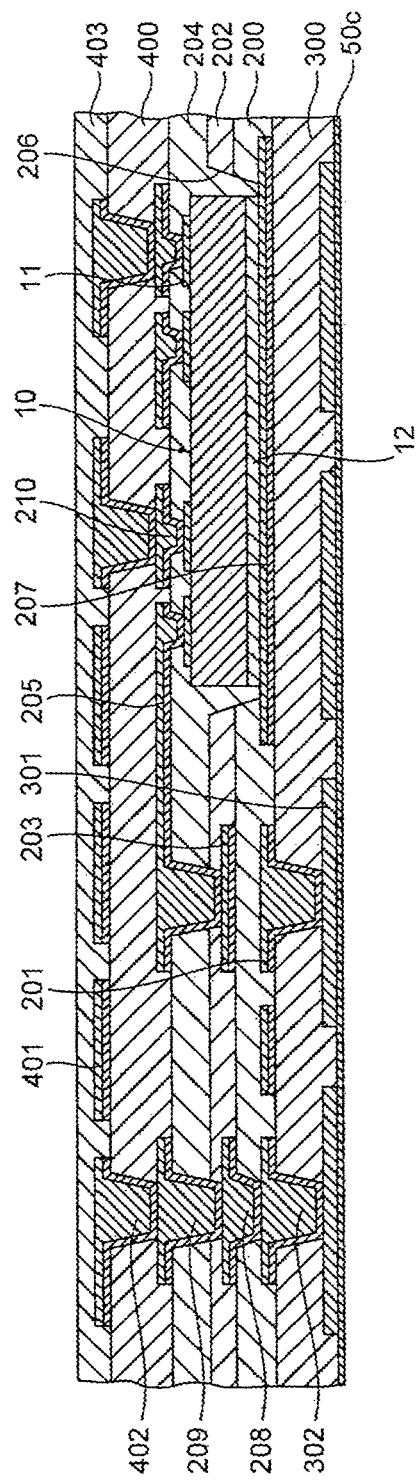
Figure 10C:
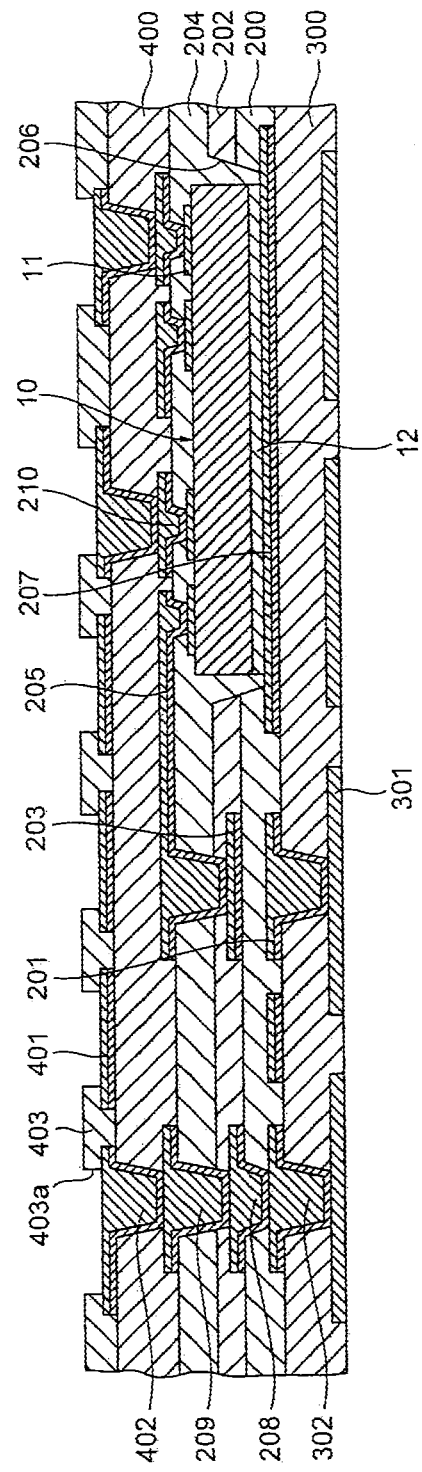
Figure 10D:
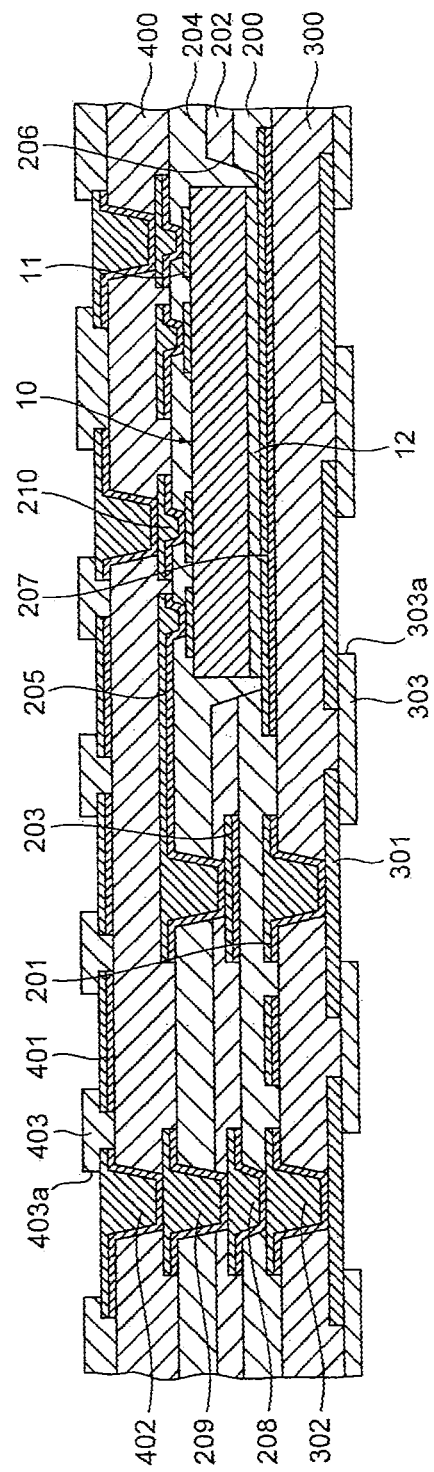
Figure 11A:
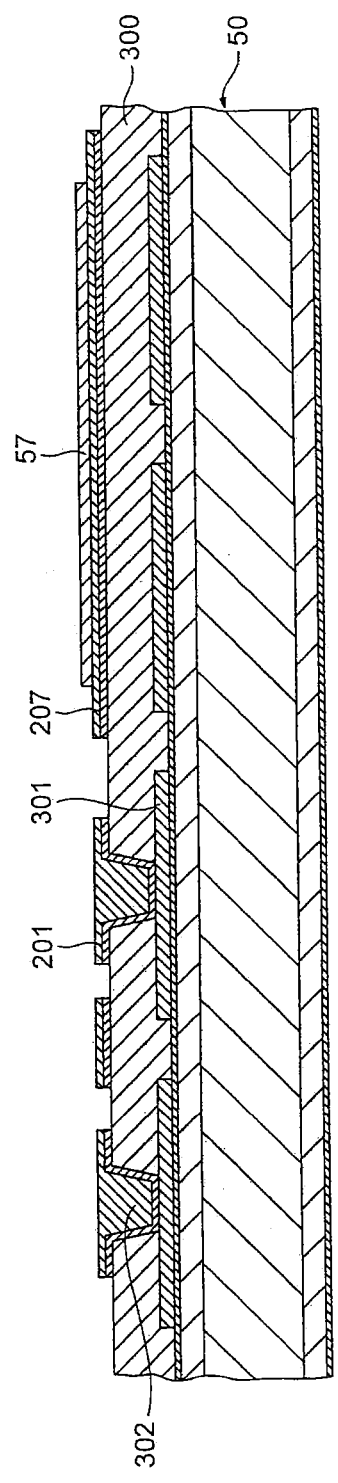
FIG. 11A to 11D are process diagrams describing another method for manufacturing a recess.
Figure 11B:
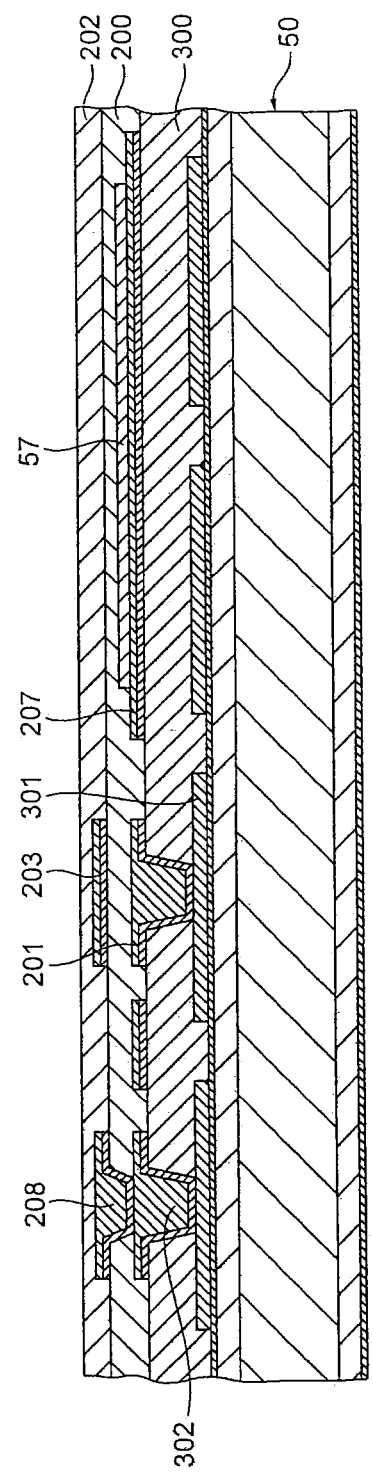
Figure 11C:
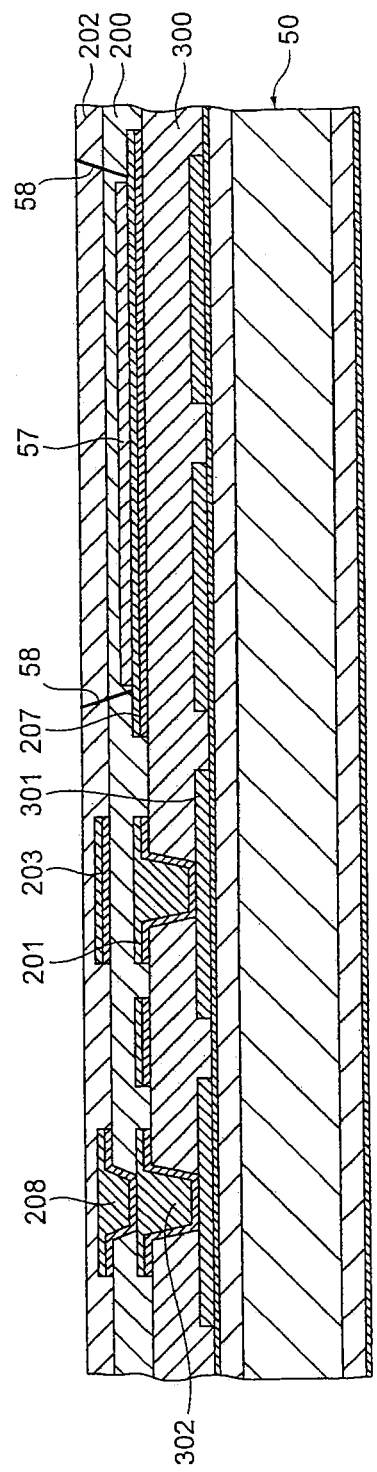
Figure 11D:
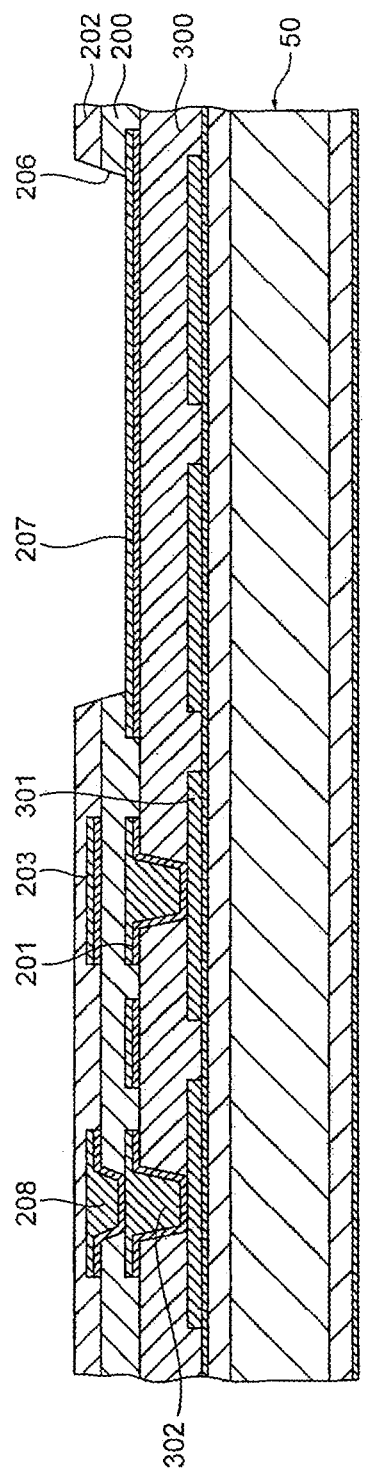

Using the above-described method, the conductor pads 401 and the via conductors 402 are respectively formed on the insulating layer 400 (see FIG. 9E). Different from the conductor pads 301 of the first build-up layer 30, the conductor pads 401 are formed, for example, by a seed layer and an electrolytic copper plating layer. Next, the solder resist layer 403 is formed on the insulating layer 400 and the conductor pads 401 (see FIG. 10A).

Third Process

The support plate 50 is removed. For example, by heating the support plate 50, the release layer between the first copper foil (50b) and the second copper foil (50c) is softened, and the second copper foil (50c) and the first copper foil (50b) are peeled off from each other. In this case, the second copper foil (50c) remains on the insulating layer 300 side of the first build-up layer 30 (see FIG. 10B). Next, the remaining second copper foil (50c) is etched and removed and thereby the conductor pads 301 of the first build-up layer 30 are exposed to the outside. Thereafter, by subjecting the solder resist layer 403 to exposure and development processing or to laser processing, the openings (403a) that each expose a portion of a conductor pad 401 to the outside are formed (see FIG. 10C).

The solder resist layer 303 is formed below the insulating layer 300 and the conductor pads 301. Thereafter, by subjecting the solder resist layer 303 to exposure and development processing or the like, the openings (303a) that each expose a portion of a conductor pad 301 to the outside are formed (see FIG. 10D). As a result, the semiconductor element built-in wiring board 1 is completed.

In the above-described manufacturing method, the semiconductor element built-in wiring board 1 is manufactured by sequentially forming the first build-up layer 30, the base substrate 20 and the second build-up layer 40 on one side of the support plate 50. Therefore, the semiconductor element built-in wiring board 1 can be manufactured using a coreless manufacturing method in which a core substrate is not provided. Therefore, as compared to a semiconductor element built-in wiring board in which a core substrate is provided, flexibility in selecting laser used in the formation of the via holes and the recess and in selecting the materials used for the insulating layers can be improved. As a result, manufacturing cost of the semiconductor element built-in wiring board 1 can be reduced. Further, since a core substrate is not provided, reduction in the thickness of the semiconductor element built-in wiring board 1 can be achieved.

Modified Embodiment of Method for Manufacturing Semiconductor Element Built-In Wiring Board In the following, with reference to FIGS. 11A-11D, a modified embodiment of the method for manufacturing the semiconductor element built-in wiring board 1 is described. In the present modified embodiment, a method for forming the recess is different from that described above, but the rest is the same as that described above.

First, following the above-described contents of FIGS. 6A-7E, the plane layer 207 and the conductor layer 201 are formed on the insulating layer 300. Next, a release layer 57 is formed on the plane layer 207 in a place where the recess 206 is to be formed (see FIG. 11A). For example, a heat resistant masking material (for example, manufactured by Asahi Chemical Research Laboratory Co., Ltd., product name: #503B-SH), or a high heat resistant masking material (for example, manufactured by Asahi Chemical Research Laboratory Co., Ltd., product name: #801B-R), or the like, is used for the release layer 57. The release layer 57 has a thickness of, for example, 1-20 µm.

Next, the insulating layer 200 is laminated on the insulating layer 300, the conductor layer 201, the plane layer 207 and the release layer 57. Next, using the above-described method, the conductor layer 203 is formed on the insulating layer 200, and the via conductors 208 are formed inside the insulating layer 200. Thereafter, the insulating layer 202 is laminated on the insulating layer 200 and the conductor layer 203 (see FIG. 11B). Next, laser is irradiated to the insulating layer 202 along a cutting line 58 for the formation of the recess (see FIG. 11C), and a portion on the release layer 57 is removed to expose the release layer 57. Next, the release layer 57 is removed, and the recess 206 is formed that exposes a portion of an upper surface of the plane layer 207 as a bottom surface (see FIG. 11D). In this way, the same recess as that of FIG. 8D can be obtained. Next, the plane layer 207 that is exposed as the bottom surface of the recess 206 is subjected to a desmear treatment and thereafter, following the above-described contents of FIGS. 8E-10D, the semiconductor element built-in wiring board 1 is manufactured.

Fourth Embodiment

Figure 12:
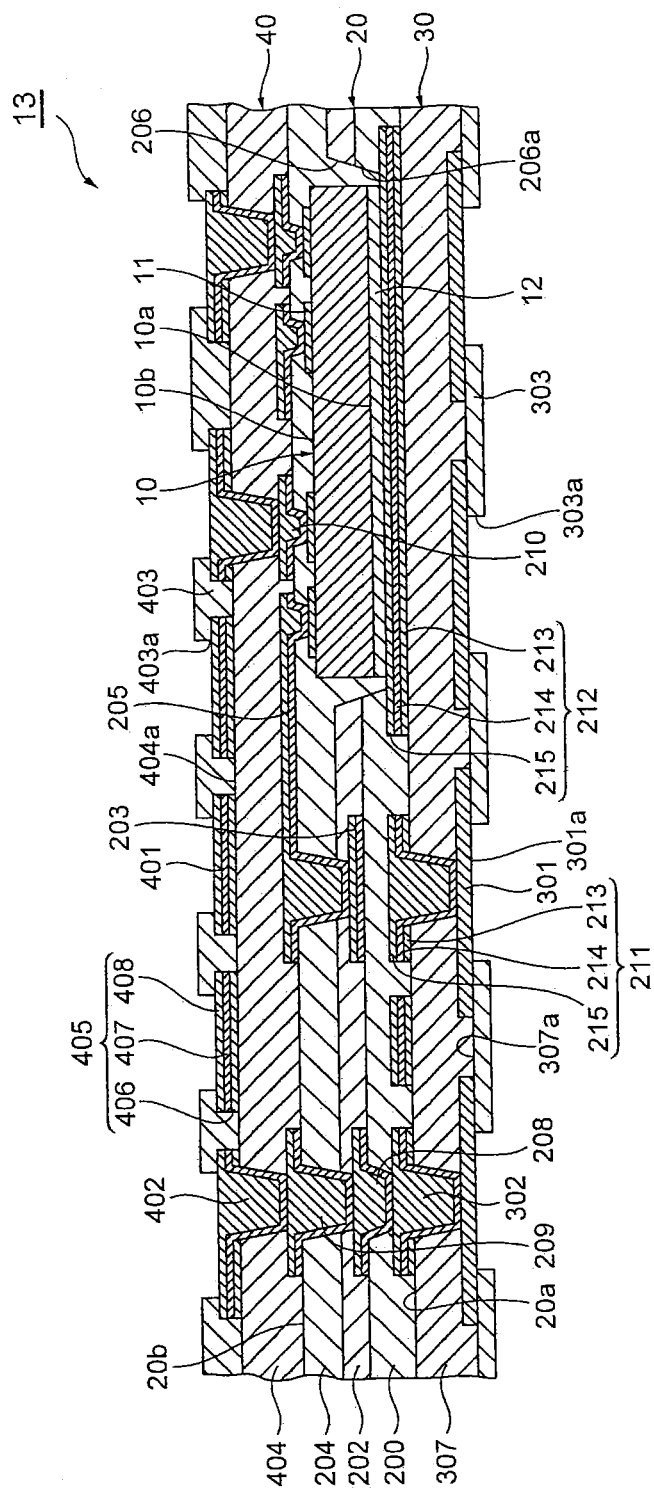
FIG. 12 is a cross-sectional view illustrating a semiconductor element built-in wiring board according to a fourth embodiment.

In the following, with reference to FIG. 12, a fourth embodiment of the present invention is described. A semiconductor element built-in wiring board 13 according to the present embodiment is different from the first embodiment in that a conductor layer 211 and a plane layer 212 that are formed side by side on the one main surface (20a) side, and conductor pads 405 of second build-up layer 40, each have a three-layer structure including a copper foil, an electroless copper plating layer and an electrolytic copper plating layer. Other structures are the same as the first embodiment.

Specifically, the conductor layer 211 and the plane layer 212 each have a copper foil 213, an electroless copper plating layer 214 and an electrolytic copper plating layer 215 in this order from the one main surface (20a) side. Further, an insulating layer 307 of the first build-up layer 30 and an insulating layer 404 of the second build-up layer 40 are each formed of a prepreg material containing a glass cloth. On the other hand, the conductor pads 405 of the second build-up layer 40 each have a copper foil 406, an electroless copper plating layer 407 and an electrolytic copper plating layer 408 in this order from an upper surface (404a) side of the insulating layer 404 (the upper surface (404a) of the insulating layer 404 being a surface of the insulating layer 404 on the opposite side of the base substrate 20). The semiconductor element built-in wiring board 13 according to the present embodiment can achieve the same operation effect as the first embodiment.

In the following, with reference to FIGS. 13A-13E, a method for manufacturing the semiconductor element built-in wiring board 13 is described. First, following the above-described contents of FIGS. 6A and 6B, the conductor pads 301 are formed on the second copper foil (50c). Next, a prepreg material containing a glass cloth, on one side of which the copper foil 213 is laminated (see FIG. 13A), is placed and laminated on the second copper foil (50c) and the conductor pads 301 (see FIG. 13B). The prepreg material containing a glass cloth forms the insulating layer 307 of the first build-up layer 30. The copper foil 213 has a thickness of, for example, about 3-5 μm.

Figure 13A:
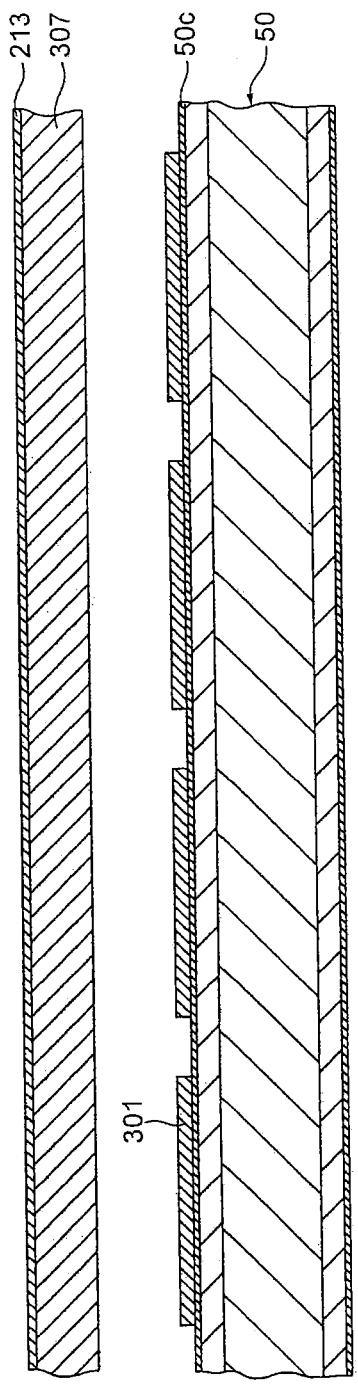
FIG. 13A to 13E are process diagrams describing a method for manufacturing the semiconductor element built-in wiring board according to the fourth embodiment.
Figure 13B:
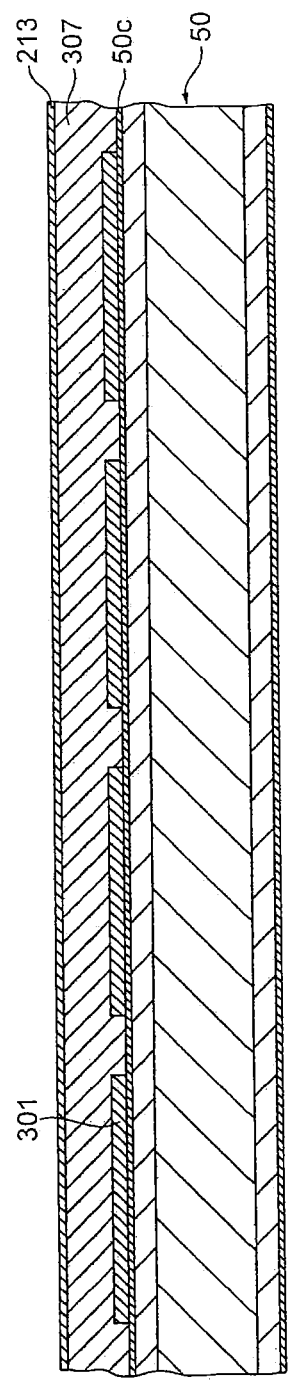
Figure 13C:
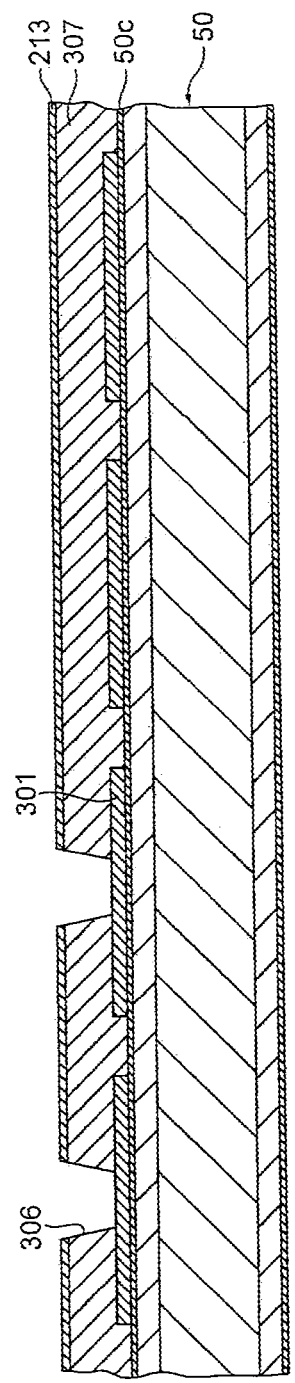
Figure 13D:
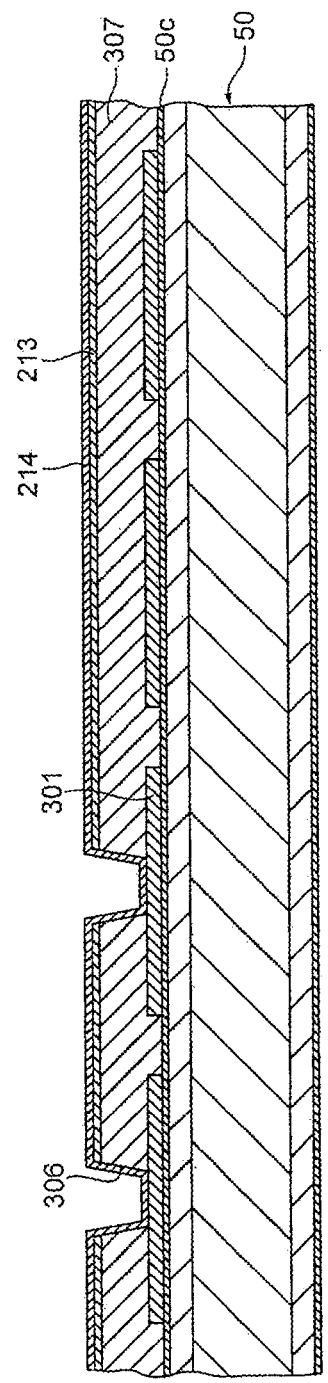
Figure 13E:
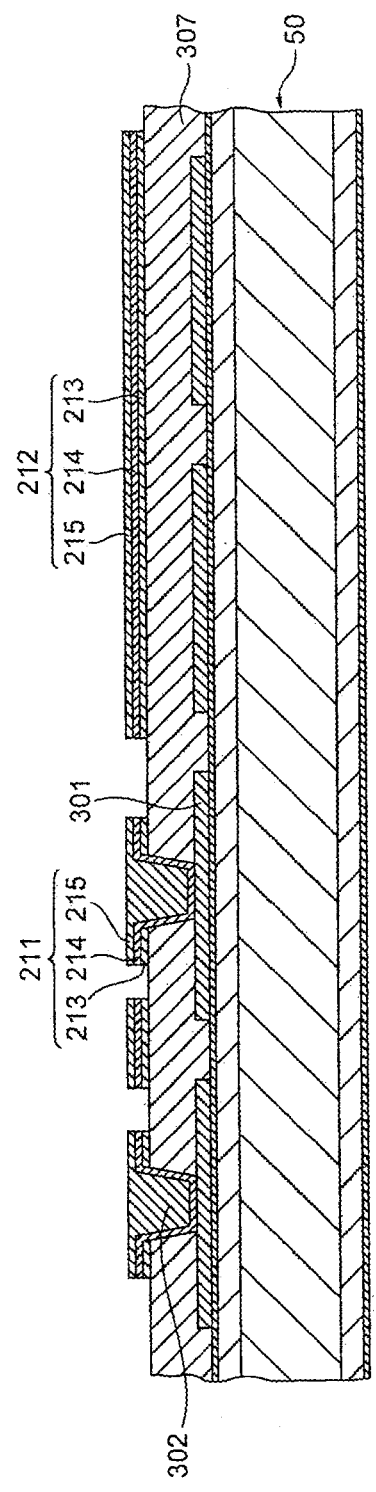

The via holes 306 are formed by laser processing at predetermined positions in the copper foil 213 and the insulating layer 307 (see FIG. 13C). Next, the inner walls and the bottom surfaces of the via holes 306 are subjected to a roughening treatment and thereafter the electroless copper plating layer 214 is formed on the upper surface of the copper foil 213 and on the inner walls and the bottom surfaces of the via holes 306 using an electroless plating method (see FIG. 13D). Next, a predetermined resist pattern is formed on the electroless copper plating layer 214, and the electrolytic copper plating layer 215 is formed on the electroless copper plating layer 214 where the resist pattern is not formed.

Thereafter, portions of the electroless copper plating layer 214 and the copper foil 213 that are exposed to the outside due to removal of the resist pattern are etched and removed. Of the copper foil 213, the electroless copper plating layer 214 and the electrolytic copper plating layer 215 that are remaining on the insulating layer 307, a portion forms the plane layer 212 and the rest forms the conductor layer 211. Further, the electroless copper plating layer 214 and the electrolytic copper plating layer 215 that are filled inside the via holes 306 form the via conductors 302 (see FIG. 13E). Next, following the above-described contents of the FIGS. 7F-10D, the semiconductor element built-in wiring board 13 is manufactured. When the second build-up layer 40 is formed, as illustrated in FIG. 13A, it is also possible to use the prepreg material containing a glass cloth, on one side of which a copper foil is laminated, to form the insulating layer 404 and the conductor pads 405.

Fifth Embodiment

Figure 14:
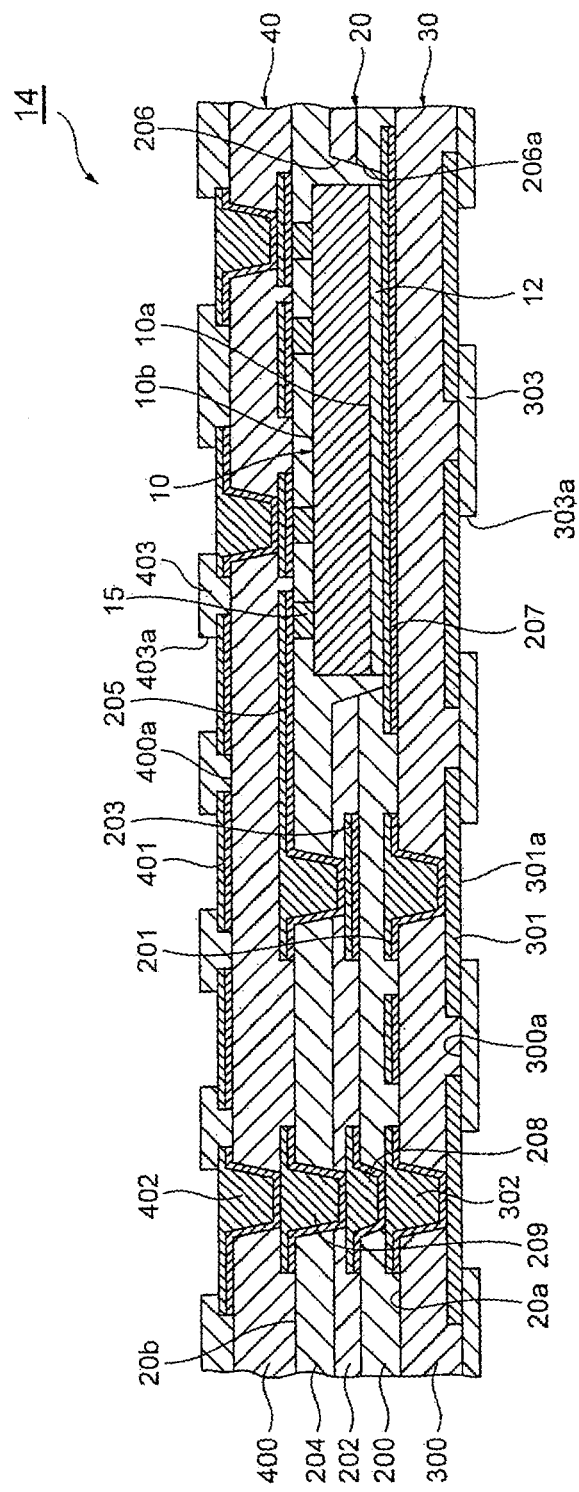
FIG. 14 is a cross-sectional view illustrating a semiconductor element built-in wiring board according to a fifth embodiment.

In the following, with reference to FIG. 14, a fifth embodiment of the present invention is described. A semiconductor element built-in wiring board 14 according to the present embodiment is different from the first embodiment in that the semiconductor element 10 is connected via conductor posts 15 to the conductor layer 205 of the base substrate 20. Other structures are the same as the first embodiment.

Specifically, the conductor posts 15 are formed on the active surface (10b) of the semiconductor element 10. The conductor posts 15 are formed of, for example, Cu, and function as terminals of the semiconductor element 10. The via conductors 210 as in the first embodiment are not formed inside the insulating layer 204 that is positioned above the semiconductor element 10. The semiconductor element 10 is directly electrically connected via the conductor posts 15 to the conductor layer 205 of the base substrate 20 (so-called landless connection).

In the semiconductor element built-in wiring board 14 according to the present embodiment, the same operation effect as the first embodiment can be obtained. In addition, since the semiconductor element 10 is directly connected via the conductor posts 15 to the conductor layer 205, it is not required to form via openings and via conductors using laser in the insulating layer 204 positioned above the semiconductor element 10, and fine connection between the conductor layer 205 and the semiconductor element 10 becomes possible.

In the following, with reference to FIGS. 15A-15D, a method for manufacturing the semiconductor element built-in wiring board 14 is described. First, following the above-described contents of FIGS. 6A-8D, the recess 206 that penetrates the insulating layer 202 and the insulating layer 200 and exposes a portion of the upper surface of the plane layer 207 as a bottom surface is formed at a predetermined position in the insulating layer 202, and the exposed portion of the plane layer 207 is subjected to a desmear treatment. Next, the semiconductor element 10, which is prepared in advance and has the conductor posts 15, is mounted in the recess 206 (see FIG. 15A). After the semiconductor element 10 is mounted, the die attach film 12 is heated and cured and thereby the semiconductor element 10 is temporarily fixed on the plane layer 207.

Figure 15A:
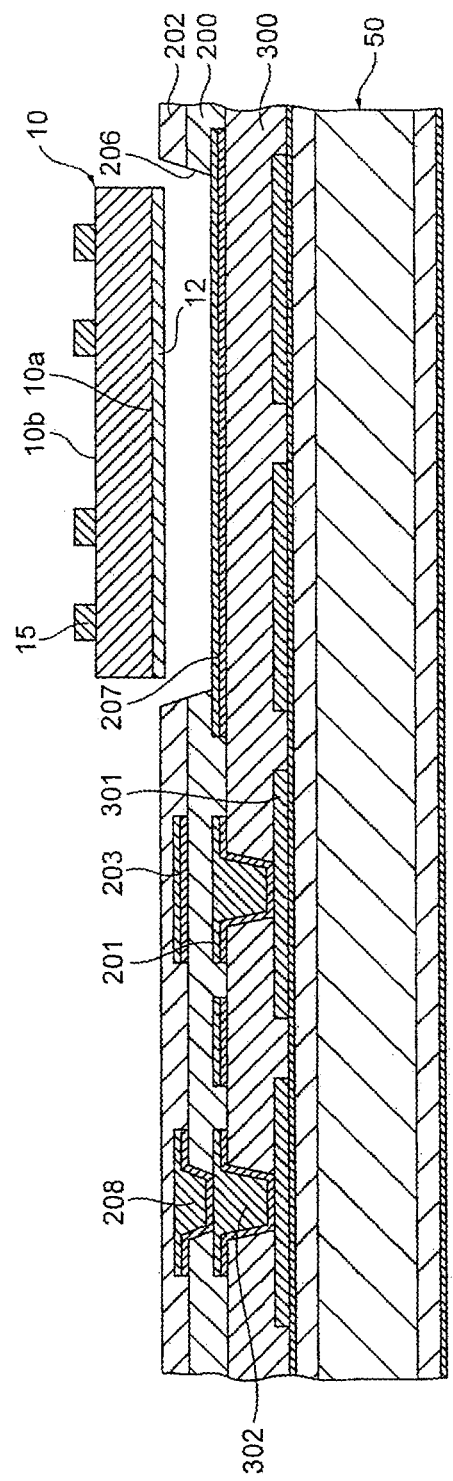
FIG. 15A to 15D are process diagrams describing a method for manufacturing the semiconductor element built-in wiring board according to the fifth embodiment.
Figure 15B:
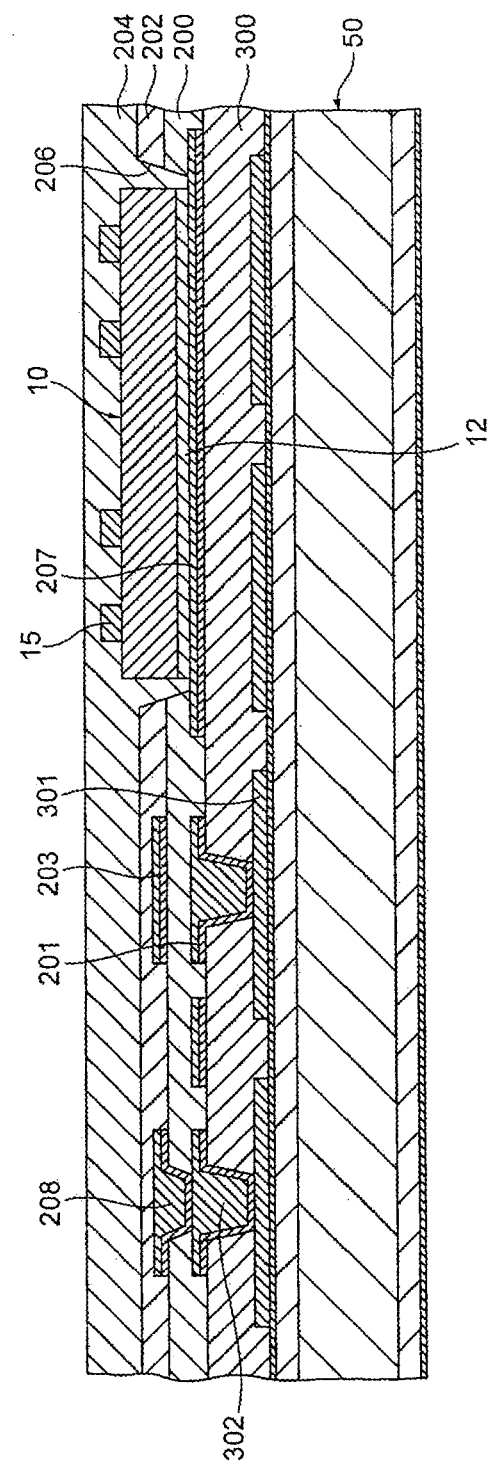
Figure 15C:
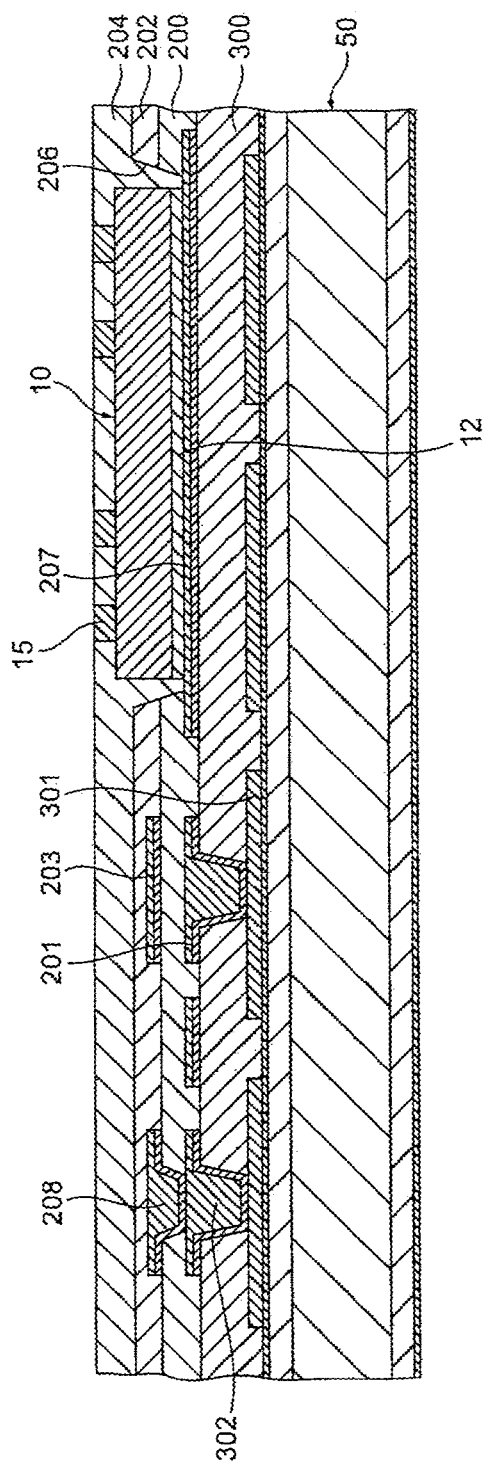
Figure 15D:
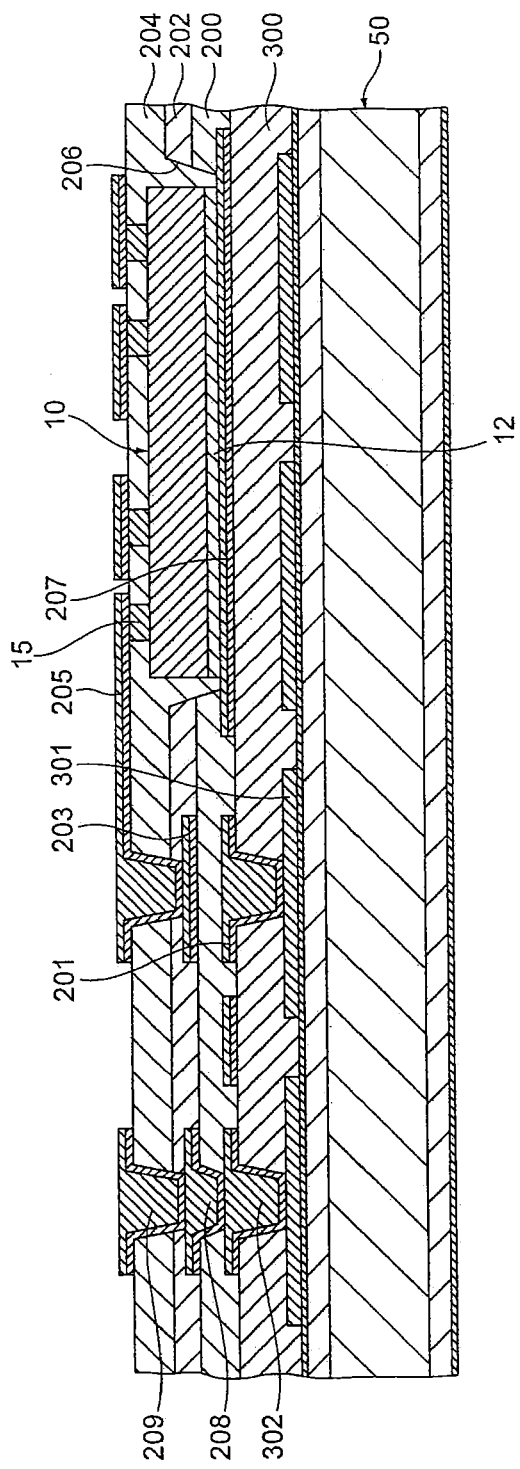

The insulating layer 204 is laminated on the insulating layer 202 and the semiconductor element 10 (see FIG. 15B). As a result, the entire semiconductor element 10 is sealed inside the insulating layer 204. Next, by polishing the surface of the insulating layer 204, the conductor posts 15 of the semiconductor element 10 are exposed to the outside (see FIG. 15C). Next, using the above-described method, the conductor layer 205 is formed on the insulating layer 204 and the conductor posts 15, and the via conductors 209 are formed inside the insulating layer 204 (see FIG. 15D). As a result, the conductor layer 205 formed above the semiconductor element 10 is directly electrically connected via the conductor posts 15 to the semiconductor element 10. Next, following the above-described contents of the FIGS. 9D-10D, the semiconductor element built-in wiring board 14 is manufactured.

In the above, embodiments of the present invention are described in detail. However, the present invention is not limited to the above-described embodiments. Various design modifications can be performed within the scope without departing from the spirit of the present invention as described in appended claims. For example, in the above-described embodiments, the first build-up layer 30 and the second build-up layer 40 are described that are each formed by laminating one insulating layer and one conductor layer (conductor pads). However, these build-up layers may also have a structure that is formed by alternately laminating multiple insulating layers and wiring layers.

Further, in addition to the above-described resin material that contains 30% or more by weight of an inorganic filler, an ABF (Ajinomoto Build-up Film) resin manufactured by Ajinomoto Fine-Techno Co., Ltd., or a photosensitive resin, may also be used for the insulating layers (200, 202, 204) of the base substrate 20. When a photosensitive resin is used for the insulating layers (200, 202, 204) of the base substrate 20, small-diameter via holes (such as the via holes (204a, 204b) of FIG. 9B) can be formed even using an exposure and development method. Further, the same material is used for the insulating layer 300 and the insulating layer 400. However, it is also possible to use different materials for the insulating layer 300 and the insulating layer 400. Further, in order to achieve improvement in electrical characteristics and noise reduction, the plane layer may also be formed as a ground layer. Further, when desired, the plane layer may also be formed by a copper foil, an electroless copper plating layer and an electrolytic copper plating layer.

In a semiconductor element built-in wiring board, a thermal stress may occur due to a difference in thermal expansion coefficients of the materials and warpage of the wiring board caused by the thermal stress is likely to occur.

A semiconductor element built-in wiring board according to an embodiment of the present invention prevents occurrence of warpage.

A semiconductor element built-in wiring board according to an embodiment of the present invention includes: a base substrate; a semiconductor element that is embedded in the base substrate; and a first build-up layer and a second build-up layer that are respectively formed on both sides of the base substrate so as to sandwich the base substrate. The semiconductor element has an active surface and a non-active surface, the active surface having a terminal, and the non-active surface being on an opposite side of the active surface. The first build-up layer has a first insulating layer that is formed on the non-active surface side of the semiconductor element, and has first conductor pads that are exposed to outside from a surface of the first insulating layer on a site opposite to the base substrate. The second build-up layer has a second insulating layer that is formed on the active surface side of the semiconductor element, and has second conductor pads that are exposed to outside from a surface of the second insulating layer on a side opposite to the base substrate. The first insulating layer and the second insulating layer are formed of a resin material that contains a reinforcing material. The first conductor pads are embedded in the first insulating layer.

According to an embodiment of the present invention, occurrence of warpage can be prevented.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board having a built-in semiconductor element, comprising:
    a base substrate;
    a semiconductor element embedded in the base substrate and having an active surface and a non-active surface on an opposite side with respect to the active surface such that the semiconductor element has a terminal on the active surface;
    a first build-up layer comprising an insulating layer and a plurality of first conductor pads such that the insulating layer is formed on a non-active surface side of the semiconductor element and that the plurality of first conductor pads has a plurality of exposed surfaces exposed from a surface of the insulating layer on an opposite side with respect to the base substrate; and
    a second build-up layer comprising an insulating layer and a plurality of second conductor pads such that the insulating layer is formed on an active surface side of the semiconductor element and that the plurality of second conductor pads has a plurality of exposed surfaces exposed from a surface of the insulating layer on an opposite side with respect to the base substrate,
    wherein the insulating layer in the first build-up layer comprises a resin material and a reinforcing material, the insulating layer in the second build-up layer comprises a resin material and a reinforcing material, the plurality of first conductor pads is embedded in the insulating layer in the first build-up layer, the base substrate comprises a first conductor layer and a plane layer formed on the first build-up layer, a first base-substrate insulating layer formed on the first build-up layer and covering the first conductor layer and plane layer, a second conductor layer formed on the first base-substrate insulating layer, a second base-substrate insulating layer formed on the first base-substrate insulating layer and covering the second conductor layer, and a third base-substrate insulating layer formed on the second base-substrate insulating layer such that no conductor layer is interposed between the second base-substrate insulating layer and the third base-substrate insulating layer, the base substrate has a recess portion penetrating through the first and second base-substrate insulating layers such that the recess portion is exposing a portion of the plane layer and accommodating the semiconductor element in the recess portion, and the third base-substrate insulating layer is formed such that the third base-substrate insulating layer is embedding the semiconductor element in the recess portion.

2. A wiring board having a built-in semiconductor element according to claim 1, wherein the plurality of first conductor pads is formed such that the exposed surfaces of the first conductor pads and the surface of the insulating layer in the first build-up layer are on a same plane.

3. A wiring board having a built-in semiconductor element according to claim 1, wherein the plurality of first conductor pads is formed such that the exposed surfaces of the first conductor pads are recessed from the surface of the insulating layer in the first build-up layer.

4. A wiring board having a built-in semiconductor element according to claim 1, wherein the plurality of first conductor pads is formed such that the exposed surfaces of the first conductor pads are recessed in a range of 3 μm to 15 μm from the surface of the insulating layer in the first build-up layer.

5. A wiring board having a built-in semiconductor element according to claim 1, wherein the insulating layers in the first and second build-up layers are made of a same material.

6. A wiring board having a built-in semiconductor element according to claim 1, wherein the insulating layer in the first build-up layer comprises the reinforcing material comprising at least one material selected from the group consisting of a glass cloth, a carbon fiber, a glass nonwoven fabric, an aramid cloth and an aramid nonwoven fabric, and the insulating layer in the second build-up layer comprises the reinforcing material comprising at least one material selected from the group consisting of a glass cloth, a carbon fiber, a glass nonwoven fabric, an aramid cloth and an aramid nonwoven fabric.

7. A wiring board having a built-in semiconductor element according to claim 1, wherein the first build-up layer comprises a plurality of insulating layers and a plurality of wiring layers formed on the plurality of insulating layers, respectively, and the second build-up layer comprises a plurality of insulating layers and a plurality of wiring layers formed on the plurality of insulating layers, respectively.

8. A wiring board having a built-in semiconductor element according to claim 1, wherein each of the first, second and third base-substrate insulating layers comprises a resin material and inorganic filler in an amount of 30% wt. to 80% wt. in the resin material.

9. A wiring board having a built-in semiconductor element according to claim 1, wherein the second base-substrate insulating layer has a thickness which is smaller than a thickness of each of the first and third base-substrate insulating layers.

10. A wiring board having a built-in semiconductor element according to claim 1, wherein the base substrate is formed such that a height at which the second base-substrate insulating layer is formed is lower than a height of the semiconductor element accommodated in the recess portion of the base substrate.

11. A wiring board having a built-in semiconductor element according to claim 1, wherein the plane layer comprises a copper foil, an electroless plating layer and an electrolytic plating layer.

12. A wiring board having a built-in semiconductor element according to claim 1, wherein the plane layer forms a ground layer.

13. A wiring board having a built-in semiconductor element according to claim 1, further comprising:

a stack via structure comprising a plurality of via conductors formed through the first build-up layer, the base substrate and the second build-up layer such that the plurality of via conductors is stacked substantially in a linear form.

14. A wiring board having a built-in semiconductor element according to claim 1, further comprising:

a first solder resist layer formed on the first build-up layer and having a plurality of opening portions such that the plurality of opening portions is exposing the plurality of first conductor pads, respectively; and a second solder resist layer formed on the second build-up layer and having a plurality of opening portions such that the plurality of opening portions is exposing the plurality of second conductor pads, respectively.

15. A wiring board having a built-in semiconductor element according to claim 1, wherein the base substrate is formed such that the base substrate includes a conductor layer formed on the third base-substrate insulating layer.

16. A wiring board having a built-in semiconductor element according to claim 15, wherein the base substrate is formed such that the base substrate includes a via conductor penetrating through the second and third base-substrate insulating layers and connecting the second conductor layer and the conductor layer formed on the third base-substrate insulating layer.

* * * * *